(12) United States Patent
He et al.

(10) Patent No.: US 11,527,438 B2
(45) Date of Patent: Dec. 13, 2022

(54) MANUFACTURING METHOD OF CONTACT STRUCTURE

(71) Applicant: United Semiconductor (Xiamen) Co., Ltd., Fujian (CN)

(72) Inventors: Xiongwu He, Fujian (CN); Weiguo Xu, Fujian (CN); Yuan-Chi Pai, Fujian (CN); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 225 days.

(21) Appl. No.: 17/109,108

(22) Filed: Dec. 1, 2020

(65) Prior Publication Data

US 2022/0139778 A1 May 5, 2022

(30) Foreign Application Priority Data

Nov. 3, 2020 (CN) .......................... 202011208320.8

(51) Int. Cl.
| | |
|---|---|
| *H01L 21/768* | (2006.01) |
| *G03F 1/42* | (2012.01) |
| *G03F 1/86* | (2012.01) |
| *G03F 7/20* | (2006.01) |
| *H01L 21/311* | (2006.01) |
| *H01L 21/66* | (2006.01) |

(52) U.S. Cl.
CPC .......... *H01L 21/76895* (2013.01); *G03F 1/42* (2013.01); *G03F 1/86* (2013.01); *G03F 7/2022* (2013.01); *H01L 21/31144* (2013.01); *H01L 21/76802* (2013.01); *H01L 21/76877* (2013.01); *H01L 22/12* (2013.01)

(58) Field of Classification Search
CPC ......... H01L 21/76895; H01L 21/31144; H01L 21/76802; H01L 21/76877; H01L 22/12; H01L 22/20; H01L 21/76816; H01L 21/76897; H01L 21/0271; G03F 1/42; G03F 1/86; G03F 7/2022; G03F 7/70425; G03F 1/00
See application file for complete search history.

(56) References Cited

U.S. PATENT DOCUMENTS

2020/0105629 A1    4/2020    Chen

FOREIGN PATENT DOCUMENTS

| CN | 111630455 A | 9/2020 |
|---|---|---|
| KR | 2001-0003438 A | 1/2001 |
| WO | 2006/126569 A1 | 11/2006 |

*Primary Examiner* — Robert G Bachner
(74) *Attorney, Agent, or Firm* — Winston Hsu

(57) ABSTRACT

A manufacturing method of a contact structure includes the following steps. A substrate is provided, and the substrate includes a first region and a second region. A dielectric layer is formed on the substrate. A photoresist layer is formed on the dielectric layer. An exposure process is performed. The exposure process includes first exposure steps and second exposure steps. Each of the first exposure steps is performed to a part of the first region of the substrate. Each of the second exposure steps is performed to a part of the second region of the substrate. Each of the second exposure steps is performed with a first overlay shift by a first predetermined distance. A develop process is performed for forming openings in the photoresist layer.

20 Claims, 16 Drawing Sheets

MANUFACTURING METHOD OF CONTACT STRUCTURE

BACKGROUND OF THE INVENTION

1. Field of the Invention

The present invention relates to a manufacturing method of a contact structure, and more particularly, to a manufacturing method of a contact structure including an exposure process.

2. Description of the Prior Art

Integrated circuit (IC) is constructed by devices and interconnections, which are formed by patterned feature in the substrate or different layers. In the fabrication of IC, the photolithography process is an essential technique. The photolithography process is configured to form designed patterns such as circuit layout patterns on one or more photomasks, and then to precisely transfer such patterns to a photoresist layer on a film by exposure and development steps. Subsequently, the complicated layout patterns are precisely transferred to a semiconductor chip by an etching process using the patterned photoresist layer as a mask.

However, in the above-mentioned manufacturing process, many factors (such as process stability, uniformity, condition of the substrate, etc.) will influence the manufacturing result and may lead to the formation of defects, and the production yield of the product may be influenced accordingly. Therefore, how to reduce defects and improve production yield through the combination of the process condition design and/or inspection approaches has always been the direction of the efforts of the related fields.

SUMMARY OF THE INVENTION

It is one of the objectives of the present invention to provide a manufacturing method of a contact structure. Different exposure steps are performed to different regions of a substrate, respectively, and some of the exposure steps are performed with an overlay shift. The process margin in some regions may become smaller accordingly, and defects generated in subsequent processes may be detected more easily. Therefore, the manufacturing method may be used to modify related process conditions for improving the manufacturing yield.

According to an embodiment of the present invention, a manufacturing method of a contact structure is provided. The manufacturing method includes the following steps. Firstly, a substrate is provided, and the substrate includes a first region and a second region. A dielectric layer is formed on the substrate, and a photoresist layer is formed on the dielectric layer. An exposure process is performed. The exposure process includes a plurality of first exposure steps and a plurality of second exposure steps. Each of the first exposure steps is performed to a part of the first region of the substrate. Each of the second exposure steps is performed to a part of the second region of the substrate, and each of the second exposure steps is performed with a first overlay shift by a first predetermined distance. Subsequently, a develop process is performed for forming a plurality of openings in the photoresist layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 14 and FIG. 15 are schematic drawings illustrating an etching process in a manufacturing method of a contact structure according to an embodiment of the present invention, wherein FIG. 15 is a schematic drawing in a step subsequent to FIG. 14.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
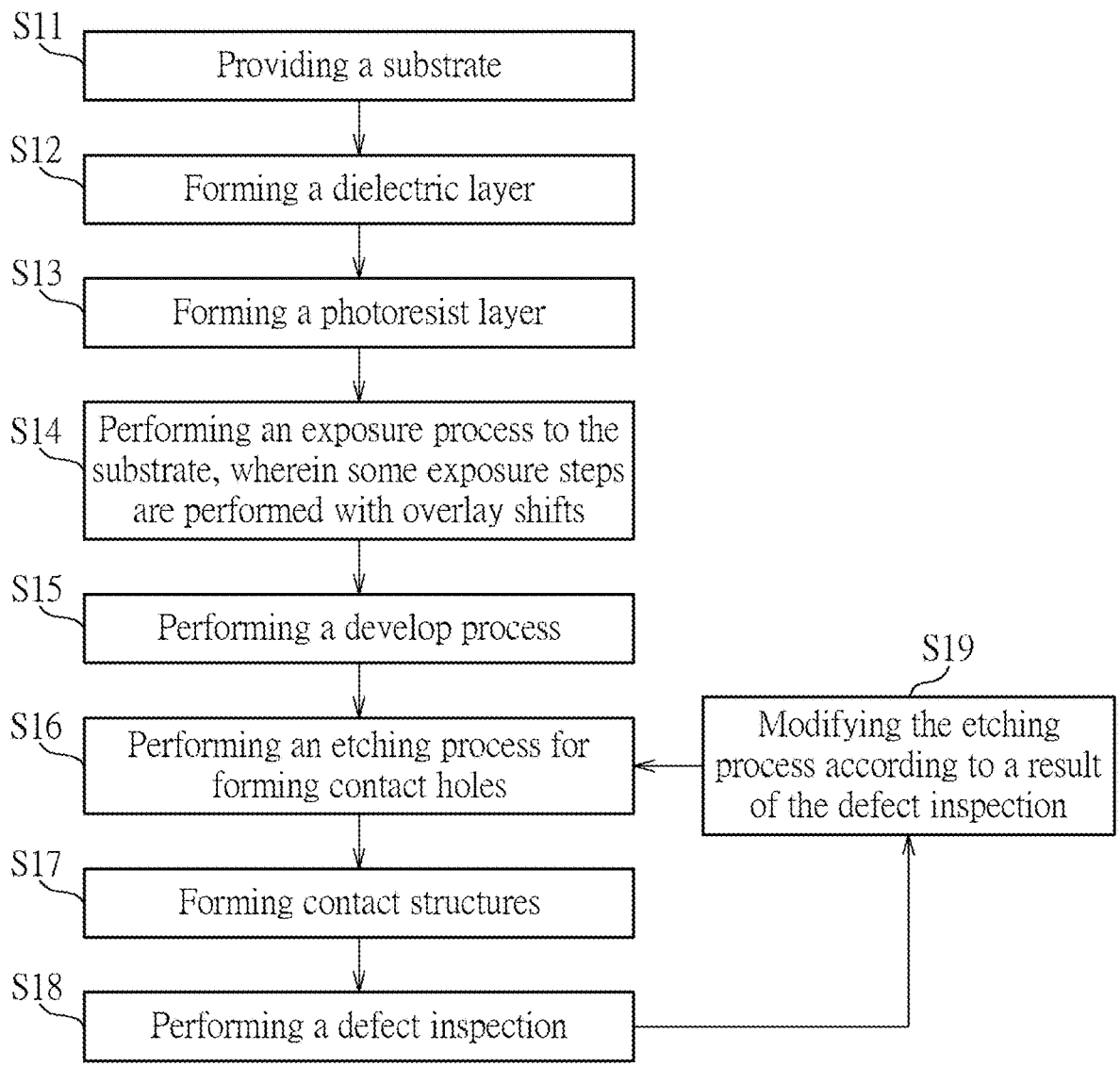
FIG. 1 is a flow chart of a manufacturing method of a contact structure according to an embodiment of the present invention.
Figure 3:
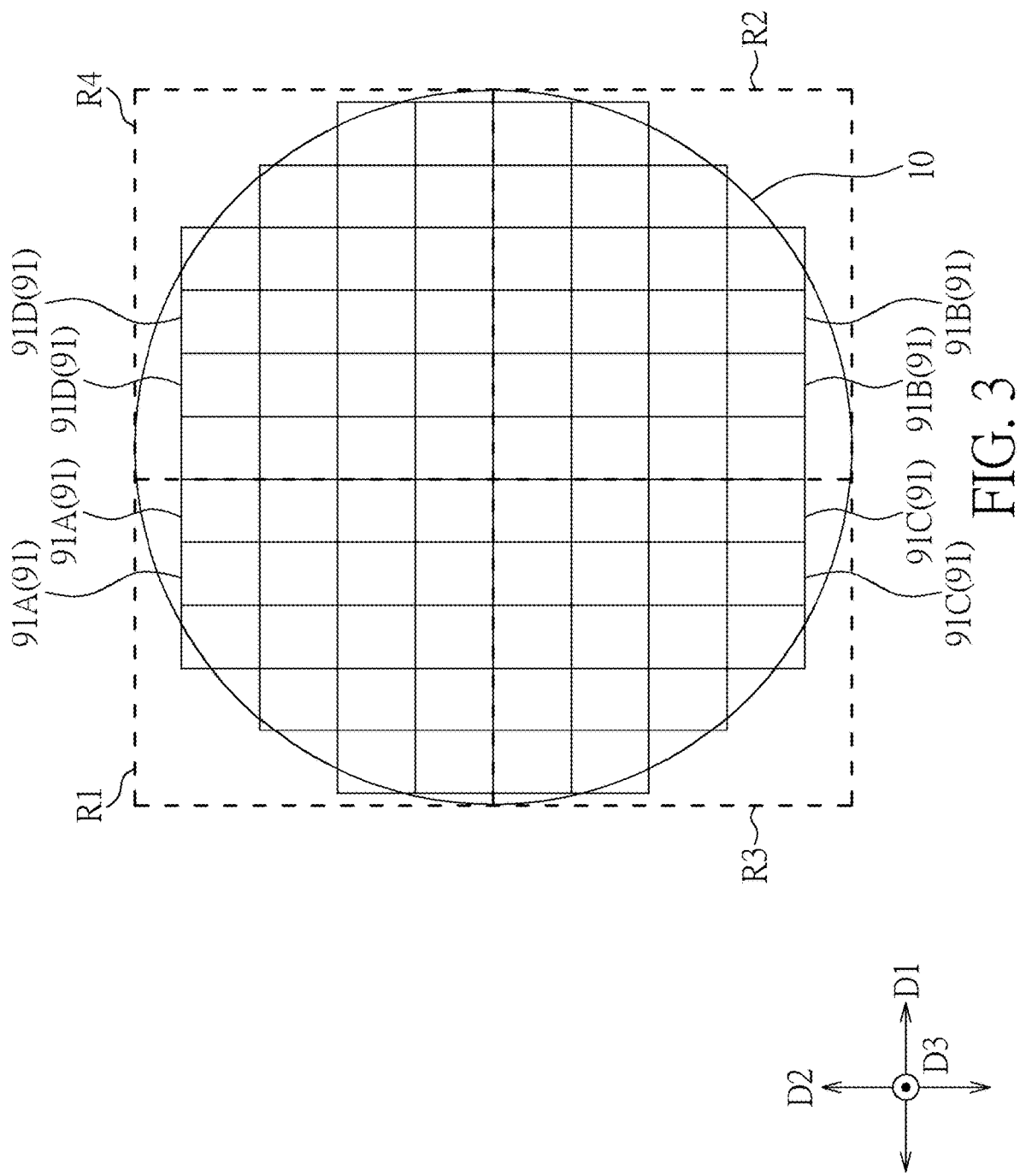
FIG. 3 is a schematic drawing illustrating an exposure process in a manufacturing method of a contact structure according to an embodiment of the present invention.

Please refer to FIG. 1 and FIG. 3. FIG. 1 is a flow chart of a manufacturing method of a contact structure according to an embodiment of the present invention, and FIG. 3 is a schematic drawing illustrating an exposure process in a manufacturing method of a contact structure according to an embodiment of the present invention. As shown in FIG. 1 and FIG. 3, a manufacturing method of a contact structure is provided in this embodiment. The manufacturing method includes the following steps. Firstly, step S11 is carried out, a substrate 10 is provided, and the substrate 10 includes a first region R1 and a second region R2. In some embodiments, the substrate 10 may include a semiconductor substrate or a non-semiconductor substrate. The semiconductor substrate mentioned above may include a silicon substrate, an epitaxial silicon substrate, a silicon germanium substrate, a silicon carbide substrate, a silicon-on-insulator (SOI) substrate, or substrates formed with other suitable semiconductor materials. The non-semiconductor substrate mentioned above may include a glass substrate, a plastic substrate, a ceramic substrate, a sapphire substrate, or substrates formed with other suitable non-semiconductor materials. Subsequently, step S12 is carried out for forming a dielectric layer (not shown in FIG. 1 and FIG. 3) on the substrate 10. In some embodiments, before the step of forming the dielectric layer, patterned structures, such as conductive lines and/or semiconductor devices, may be formed on the substrate 10, and the dielectric layer may cover the pattern structures, but not limited thereto. After the step of forming the dielectric layer, step S13 is carried out for forming a photoresist layer (not shown in FIG. 1 and FIG. 3) on the dielectric layer. Subsequently, step S14 is carried out for performing an exposure process 91 to the substrate 10, and some exposure steps are performed with an overlay shift. Step S15 is then carried out for performing a develop process configured to form a plurality of openings (not shown in FIG. 1 and FIG. 3) in the photoresist layer.

In some embodiments, the exposure process 91 may include a plurality of normal exposure steps performed without intentional overlay shifts and a plurality of deviated exposure steps performed with overlay shifts, and the overlay shifts of at least two of the deviated exposure steps may be different from each other. The normal exposure steps and the deviated exposure steps may be performed to different regions of the substrate 10 respectively. Therefore, the normal exposure steps and the deviated exposure steps may be different exposure shots in the exposure process 91 respectively, and exposed regions corresponding to the normal exposure steps and exposure regions corresponding to the normal exposure steps and the deviated exposure steps may not overlap one another or partially overlap at a peripheral portion of each exposed region, but not limited thereto. In some embodiments, the exposure process 91 may be performed in an exposure apparatus. The exposure apparatus may include a stepper exposure machine, a scanner exposure machine, or other exposure apparatus that can be used in semiconductor manufacturing processes. The wavelength range of the exposure light source used in the exposure apparatus and the dose of each exposure shot may be adjusted and selected according to the material characteristics of the photoresist layer, the resolution requirements of the product, and/or other process considerations.

In some embodiments, the exposure process 91 may include a plurality of first exposure steps 91A and a plurality of second exposure steps 91B. Each of the first exposure steps 91A is performed to a part of the first region R1 of the substrate 10. Each of the second exposure steps 91B is performed to a part of the second region R2 of the substrate 10, and each of the second exposure steps 91B is performed with a first overlay shift by a first predetermined distance. In other words, each of the first exposure steps 91A may be regarded as the above-mentioned normal exposure step performed without an intentional overlay shift, and each of the second exposure steps 91B may be regarded as the above-mentioned deviated exposure step performed with an overlay shift. In some embodiments, each of the first exposure steps 91A may be performed with a photomask (not shown in FIG. 1 and FIG. 3), and each of the second exposure steps 91B may be performed with the photomask. In other words, the first exposure steps 91A and the second exposure steps 91B may be performed with the same photomask, but the present invention is not limited to this. In some embodiments, different photomasks may be used to perform the first exposure step 91A and the second exposure step 91B respectively according to design and/or process requirements. Additionally, in some embodiments, each of the normal exposure steps and each of the deviated exposure steps in the exposure process 91 may be performed with the same photomask for reducing the negative influence generated by the difference between different photomask, but not limited thereto.

In some embodiments, the first exposure steps 91A may be performed to different parts in the first region R1 of the substrate 10, and the second exposure steps 91B may be performed to different parts in the second region R2 of the substrate 10. For example, as shown in FIG. 3, each rectangular block marked with 91A in the first region R1 may be a region corresponding to one of the first exposure steps 91A, and each rectangular block marked with 91B in the second region R2 may be a region corresponding to one of the second exposure steps 91B. Therefore, in some embodiments, seventeen first exposure steps 91A may be performed to the first region R1 of the substrate 10, and twenty-one second exposure steps 91B may be performed to the second region R2 of the substrate 10, but not limited thereto. In some embodiments, the amount of the first exposure steps 91A and the amount of the second exposure steps 91B in the exposure process 91 may vary according to the change in the proportion of areas occupied by the first region R1 and the second region R2 in the substrate 10, and the total amount of the first exposure steps 91A in the exposure process 91 may be identical to or different from the total amount of the second exposure steps 91B. In addition, the regions corresponding to the normal exposure steps performed without intentional overlay shifts (such as the first exposure steps 91A) in the substrate 10 may be disposed adjacent to one another and disposed in a centralized configuration without being disposed alternately with the regions corresponding to the deviated exposure steps (such as the second exposure steps 91B) in the substrate 10. In other words, there is not a region corresponding to the deviated exposure step (such as the second exposure step 91B) and disposed between two regions corresponding to two first exposure steps 91A respectively in the first region R1.

Figure 2:
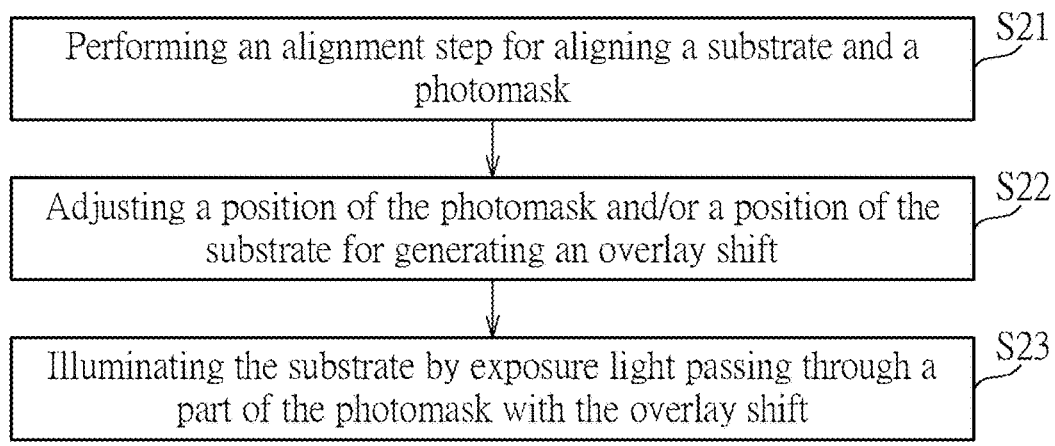
FIG. 2 is a flow chart of an exposure step in a manufacturing method of a contact structure according to an embodiment of the present invention.

Please refer to FIGS. 1-3. FIG. 2 is a flow chart of an exposure step in a manufacturing method of a contact structure according to an embodiment of the present invention. As shown in FIGS. 1-3, in some embodiments, an exposure step (such as the deviated exposure step described above) in the exposure process 91 may include but is not limited to the following steps. Firstly, in step S21, an alignment step is performed for aligning the substrate 10 and the photomask. Subsequently, in step S22, a position of the photomask and/or a position of the substrate 10 may be adjusted for generating an overlay shift. Subsequently, in step S23, the substrate 10 may be illuminated by exposure light passing through a part of the photomask with the overlay shift. In some embodiments, an overlay alignment may be carried out using overlay marks on the photomask and corresponding overlay marks on the substrate 10 for realizing the alignment step in step S21, but not limited thereto. Additionally, in some embodiments, the required overlay shift may be generated by adjusting the position of the photomask and/or the position of the substrate 10 after the alignment step, but the present invention is not limited to this. In some embodiments, other suitable methods may be used to generate the required overlay shift according to the design and/or operation of the exposure apparatus. For example, the alignment step may be carried out with an offset by a predetermined distance directly for generating the required overlay shift, but not limited thereto.

In some embodiments, each of the second exposure steps 91B may be regarded as the above-mentioned deviated exposure step performed with the overlay shift, and the second exposure step 91B may include but is not limited to the step S21, the step S22, and the step S23 described above. Therefore, the second exposure step 91B may include adjusting a position of the photomask and/or a position of the substrate 10 for generating the first overlay shift and illuminating the substrate 10 by exposure light passing through a part of the photomask with the first overlay shift. Additionally, each of the first exposure steps 91A may be regarded as the above-mentioned normal exposure step performed without an intentional overlay shift. Therefore, in some embodiments, the first exposure step 91A may be similar to the second exposure step 91B except for the above-mentioned step for generating the overlay shift (such as the step S22 described above), and the first exposure step 91A may include performing an alignment step for aligning the substrate 10 and the photomask and illuminating a part of the substrate 10 by exposure light passing through the photomask without an intentional overlay shift between the substrate 10 and the photomask. It is worth noting that there may be an inevitable overlay shift in the exposure result of the normal exposure step performed without an intentional overlay shift because of the influence of process stability, but the overlay shift of the deviated exposure step performed with the intentional overlay shift is different from the inevitable overlay shift possibly occurring in the normal exposure step, and at least some of the overlay shifts of the deviated exposure steps may be greater than the inevitable overlay shift possibly occurring in the normal exposure step.

Figure 4:
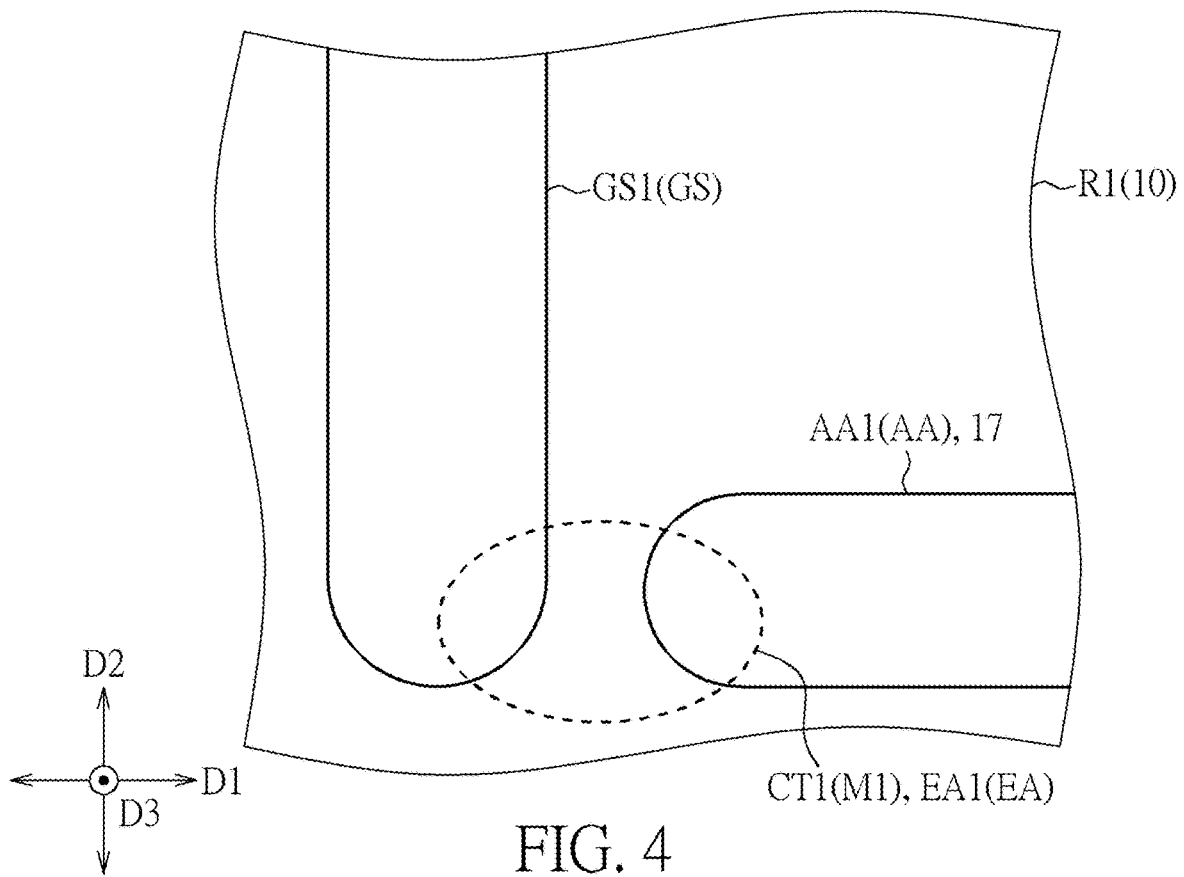
FIG. 4 is a schematic drawing illustrating a first exposure step according to an embodiment of the present invention.
Figure 5:
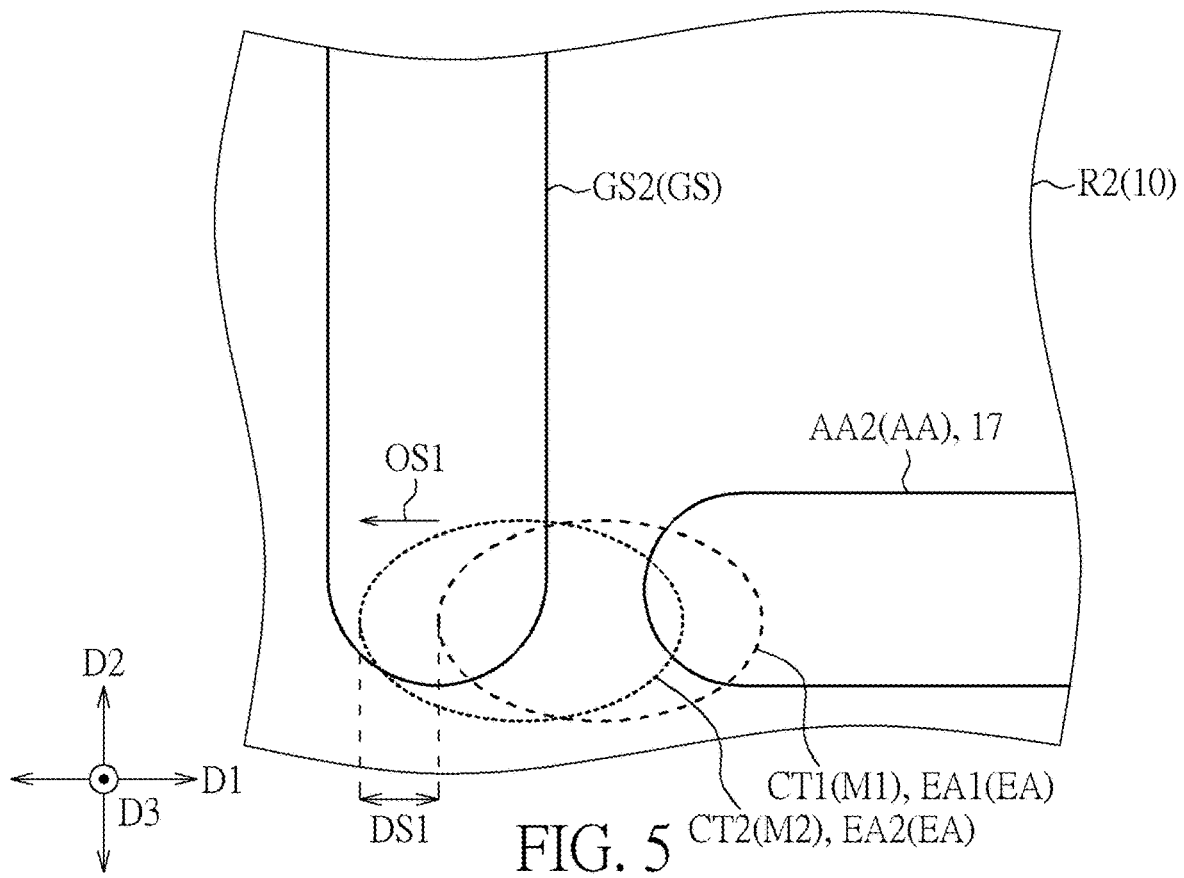
FIG. 5 is a schematic drawing illustrating a second exposure step according to an embodiment of the present invention.
Figure 6:
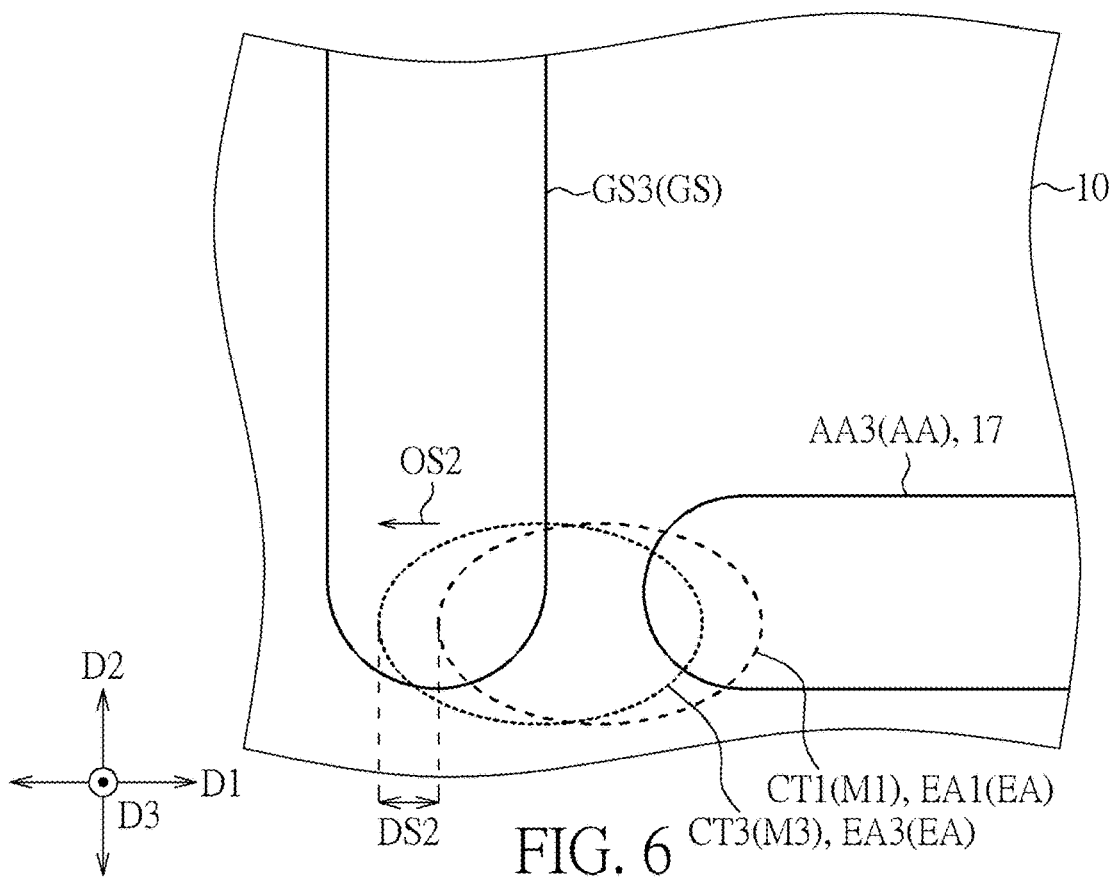
FIG. 6 is a schematic drawing illustrating a third exposure step according to an embodiment of the present invention.
Figure 7:
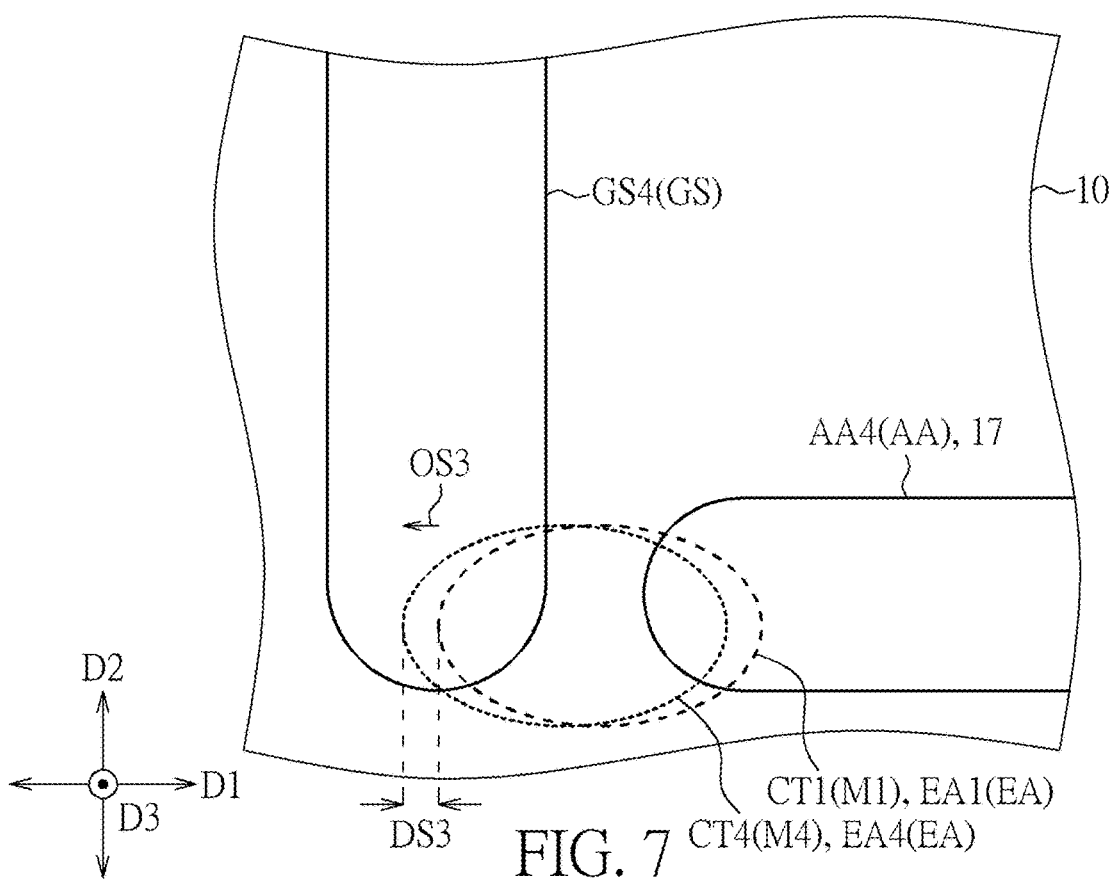
FIG. 7 is a schematic drawing illustrating a fourth exposure step according to an embodiment of the present invention.

Please refer to FIGS. 3-7. FIG. 4 is a schematic drawing illustrating a first exposure step according to an embodiment of the present invention, FIG. 5 is a schematic drawing illustrating a second exposure step in this embodiment, FIG. 6 is a schematic drawing illustrating a third exposure step in this embodiment, and FIG. 7 is a schematic drawing illustrating a fourth exposure step in this embodiment. As shown in FIG. 3, in some embodiments, the substrate 10 may further include a third region R3 and a fourth region R4, and the exposure process 91 may further include a plurality of third exposure steps 91C and a plurality of fourth exposure steps 91D. Each of the third exposure steps 91C is performed to a part of the third region R3 of the substrate 10, and each of the fourth exposure steps 91D is performed to a part of the fourth region R4 of the substrate 10, but not limited thereto. In some embodiments, each of the second exposure steps 91B, each of the third exposure steps 91C, and each of the fourth exposure steps 91D are deviated exposure steps performed with different overlay shifts, and the exposure process 91 may include multiple sets of deviated exposure steps with different overlay shifts (such as three sets shown in FIG. 3), but not limited thereto. In some embodiments, the exposure process 91 may include only one set of deviated exposure steps (such as the second exposure steps 91B), two sets of deviated exposure steps with different overlay shifts, or more than three sets of deviated exposure steps with different overlay shifts according to some design considerations.

Additionally, in some embodiments, the regions (such as the first region R1, the second region R2, the third region R3, and the fourth region R4) corresponding to the normal exposure steps performed without intentional overlay shifts (such as the first exposure steps 91A) and the deviated exposure steps performed with different overlay shifts (such as the second exposure steps 91B, the third exposure steps 91C, and the third exposure steps 91D) in the substrate 10 may be arranged in a matrix configuration for distinguish the corresponding exposure condition more conveniently in the defect inspection performed subsequently, and the exposure process 91 may be regarded as an exposure process with an overlay shift matrix, but not limited thereto. Additionally, the regions corresponding to the normal exposure steps performed without intentional overlay shifts (such as the first exposure steps 91A) in the substrate 10 may be disposed adjacent to one another and disposed in a centralized configuration, and the regions corresponding to the deviated exposure steps performed different overlay shifts (such as the second exposure steps 91B, the third exposure steps 91C, and the fourth exposure steps 91D) in the substrate 10 may be disposed adjacent to one another and disposed in a centralized configuration respectively. In other words, there is not a region corresponding to the deviated exposure step and disposed between two regions corresponding to two first exposure steps 91A respectively in the first region R1; there is not a region corresponding to the first exposure step 91A and disposed between two regions corresponding to two second exposure steps 91B in the second region R2; there is not a region corresponding to other deviated exposure step (such as the third exposure step 91C and/or the fourth exposure step 91D) and disposed between two regions corresponding to two second exposure steps 91B in the second region R2; there is not a region corresponding to the first exposure step 91A and disposed between two regions corresponding to two third exposure steps 91C in the third region R3; there is not a region corresponding to other deviated exposure step (such as the second exposure step 91B and/or the fourth exposure step 91D) and disposed between two regions corresponding to two third exposure steps 91C in the third region R3; there is not a region corresponding to the first exposure step 91A and disposed between two regions corresponding to two fourth exposure steps 91D in the fourth region R4; and there is not a region corresponding to other deviated exposure step (such as the second exposure step 91B and/or the third exposure step 91C) and disposed between two regions corresponding to two fourth exposure steps 91D in the fourth region R4.

As shown in FIGS. 3-7, in some embodiments, each of the second exposure steps 91B may be performed with a first overlay shift OS1 by a first predetermined distance DS1, each of the third exposure steps 91C may be performed with a second overlay shift OS2 by a second predetermined distance DS2, and each of the fourth exposure steps 91D may be performed with a third overlay shift OS3 by a third predetermined distance DS3. In some embodiments, at least two of the first predetermined distance DS1, the second predetermined distance DS2, or the third predetermined distance DS3 may be different from one another, and at least two of the first overlay shift OS1, the second overlay shift OS2, or the third overlay shift OS3 may be different from one another. For example, in some embodiments, the first predetermined distance DS1, the second predetermined distance DS2, and the third predetermined distance DS3 may be equal to 15 nanometers, 10 nanometers, and 5 nanometers respectively and may be different from one another accordingly, and the first overlay shift OS1, the second overlay shift OS2, and the third overlay shift OS3 may be different from one another accordingly, but not limited thereto. Additionally, in some embodiments, the shift amount of the inevitable overlay shift possibly occurring in the normal exposure step described above may be less than 5 nanometers, and the overlay shift of the deviated exposure step may be greater than the inevitable overlay shift possibly occurring in the normal exposure step, but not limited thereto. In some embodiments, the shift amount of the inevitable overlay shift possibly occurring in the normal exposure step described above may range from the first predetermined distance DS1 to the second predetermined distance DS2 or range from the second predetermined distance DS2 to the third predetermined distance DS3.

In addition, the photomask used in each of the first exposure steps 91A may be regarded as a first photomask M1, the photomask used in each of the second exposure steps 91B may be regarded as a second photomask M2, the photomask used in each of the third exposure steps 91C may be regarded as a third photomask M3, and the photomask used in each of the fourth exposure steps 91D may be regarded as a fourth photomask M4. In some embodiments, the first exposure steps 91A, the second exposure steps 91B, the third exposure steps 91C, and the fourth exposure steps 91D may be performed with the same photomask, and the first photomask M1, the second photomask M2, the third photomask M3, and the fourth photomask M4 may be the identical photomask, but not limited thereto. In some embodiments, the first exposure step 91A, the second exposure step 91B, the third exposure step 91C, and the fourth exposure step 91D may be performed with different photomasks, respectively, according to design and/or product requirements.

In some embodiments, before the step of forming the dielectric layer described above, a plurality of active regions AA and a plurality of gate structures GS may be formed on the substrate 10. For example, before the step of forming the dielectric layer described above, at least one first active region AA1, at least one second active region AA2, at least one third active region AA3, and at least one fourth active region AA4 may be formed in the first region R1, the second region R2, the third region R3, and the fourth region R4 of the substrate 10, respectively, and at least one first gate structure GS1, at least one second gate structure GS2, at least one third gate structure GS3, and at least one fourth gate structure GS4 may be formed on the first region R1, the second region R2, the third region R3, and the fourth region R4 of the substrate 10, respectively, but not limited thereto. Additionally, the dielectric layer may cover the first active region AA1, the second active region AA2, the third active region AA3, the fourth active region AA4, the first gate structure GS1, the second gate structure GS2, the third gate structure GS3, and the gate structure GS4, but not limited thereto. Additionally, the photomask used in the exposure process 91 may include a plurality of contact patterns for corresponding to the locations of contact structures formed on the substrate 10. For instance, the first photomask M1, the second photomask M2, the third photomask M3, and the fourth photomask M4 may include a first contact pattern CT1, a second contact pattern CT2, a third contact pattern CT3, and a fourth contact pattern CT4, respectively. When the first photomask M1, the second photomask M2, the third photomask M3, and the fourth photomask M4 are one identical photomask, the first contact pattern CT1, the second contact pattern CT2, the third contact pattern CT3, and the fourth contact pattern CT4 may be the same contact pattern in the photomask or different contact patterns in the photomask, but not limited thereto.

In some embodiments, a first exposed region EA1 that is formed in the photoresist layer and formed by at least one of the first exposure steps 91A via the first contact pattern CT1 may overlap a part of the first active region AA1 in a vertical direction (such as a third direction D3) and overlap a part of the first gate structure GS1 in the third direction D3; a second exposed region EA2 that is formed in the photoresist layer and formed by at least one of the second exposure steps 91B via the second contact pattern CT2 may overlap a part of the second active region AA2 in the third direction D3 and overlap a part of the second gate structure GS2 in the third direction D3; a third exposed region EA3 that is formed in the photoresist layer and formed by at least one of the thirds exposure steps 91C via the third contact pattern CT3 may overlap a part of the third active region AA3 in the third direction D3 and overlap a part of the third gate structure GS3 in the third direction D3; and a fourth exposed region EA4 that is formed in the photoresist layer and formed by at least one of the fourth exposure steps 91D via the fourth contact pattern CT4 may overlap a part of the fourth active region AA4 in the third direction D3 and overlap a part of the fourth gate structure GS4 in the third direction D3, but not limited thereto. In some embodiments, the third direction D3 described above may be regarded as a thickness direction of the substrate 10 and may be substantially orthogonal to a surface of the substrate 10, but not limited thereto. In addition, it is worth noting that the first contact pattern CT1 and the first exposed region EA1 represented in FIGS. 5-7 do not exist in the second exposure step 91B, the third exposure step 91C, and the fourth exposure step 91D actually and are only used to illustrate the condition of different overlay shifts. Additionally, in each exposure step, the contact pattern CT may be transferred to the photoresist layer for forming the exposed region EA by an appropriate proportion. Therefore, the exposed region EA and the corresponding contact pattern CT may be proportional to each other, the exposed region EA may be smaller than the corresponding contact pattern CT, or the exposed region EA may be greater than the corresponding contact pattern CT. Accordingly, the first overlay shift OS1, the second overlay shift OS2, and the third overlay shift OS3 described above may be regarded as the relative deviation between the second exposed region EA2 and the first exposed region EA1, the relative deviation between the third exposed region EA3 and the first exposed region EA1, and the relative deviation between the fourth exposed region EA4 and the first exposed region EA1, respectively, and the first predetermined distance DS1, the second predetermined distance DS2, and the third predetermined distance DS3 described above may be regarded as the relative shift amount between the second exposed region EA2 and the first exposed region EA1, the relative shift amount between the third exposed region EA3 and the first exposed region EA1, and the relative shift amount between the fourth exposed region EA4 and the first exposed region EA1, respectively, but not limited thereto.

In some embodiments, each of the gate structures GS and the corresponding active region AA may be disposed adjacent to each other in a horizontal direction (such as a first direction D1). For instance, the first gate structure GS1 and the first active region AA1 may be disposed adjacent to each other in the first direction D1, the second gate structure GS2 and the second active region AA2 may be disposed adjacent to each other in the first direction D1, the third gate structure GS3 and the third active region AA3 may be disposed adjacent to each other in the first direction D1, and the fourth gate structure GS4 and the fourth active region AA4 may be disposed adjacent to each other in the first direction D1. Additionally, in some embodiments, in the top-view diagram, the active region AA may be substantially elongated in the first direction D1, the gate structure GS may be substantially elongated in a second direction D2, and the second direction D2 may be substantially orthogonal to the first direction D1, but not limited thereto.

In some embodiments, the overlay shifts if different deviated exposure steps may be generated in the same direction for changing an area where the contact pattern and the active region overlap and an area where the contact pattern and the gate structure overlap. For instance, the first overlay shift OS1 of each of the second exposure steps 91B, the second overlay shift OS2 of each of the third exposure steps 91C, and the third overlay shift of each of the fourth exposure steps 91D may be generated in the first direction D1. Therefore, an area of the part of the second active region AA2 overlapped by the second exposed region EA2 in the third direction D3 may be smaller than an area of the part of the first active region AA1 overlapped by the first exposed region EA1 in the third direction D3; an area of the part of the third active region AA3 overlapped by the third exposed region EA3 in the third direction D3 may be smaller than the area of the part of the first active region AA1 overlapped by the first exposed region EA1 in the third direction D3 and greater than the area of the part of the second active region AA2 overlapped by the second exposed region EA2 in the third direction D3; and an area of the part of the fourth active region AA3 overlapped by the fourth exposed region EA4 in the third direction D3 may be smaller than the area of the part of the first active region AA1 overlapped by the first exposed region EA1 in the third direction D3 and greater than the area of the part of the third active region AA3 overlapped by the third exposed region EA3 in the third direction D3. Comparatively, an area of the part of the second gate structure GS2 overlapped by the second exposed region EA2 in the third direction D3 may be greater than an area of the part of the first gate structure GS1 overlapped by the first exposed region EA1 in the third direction D3, an area of the part of the third gate structure GS3 overlapped by the third exposed region EA3 in the third direction D3 may be greater than the area of the part of the first gate structure GS1 overlapped by the first exposed region EA1 in the third direction D3 and smaller than the area of the part of the second gate structure GS2 overlapped by the second exposed region EA2; and an area of the part of the fourth gate structure GS4 overlapped by the fourth exposed region EA4 in the third direction D3 may be greater than the area of the part of the first gate structure GS1 overlapped by the first exposed region EA1 in the third direction D3 and smaller than the area of the part of the third gate structure GS3 overlapped by the third exposed region EA3 in the third direction D3, but not limited thereto.

Figure 8:
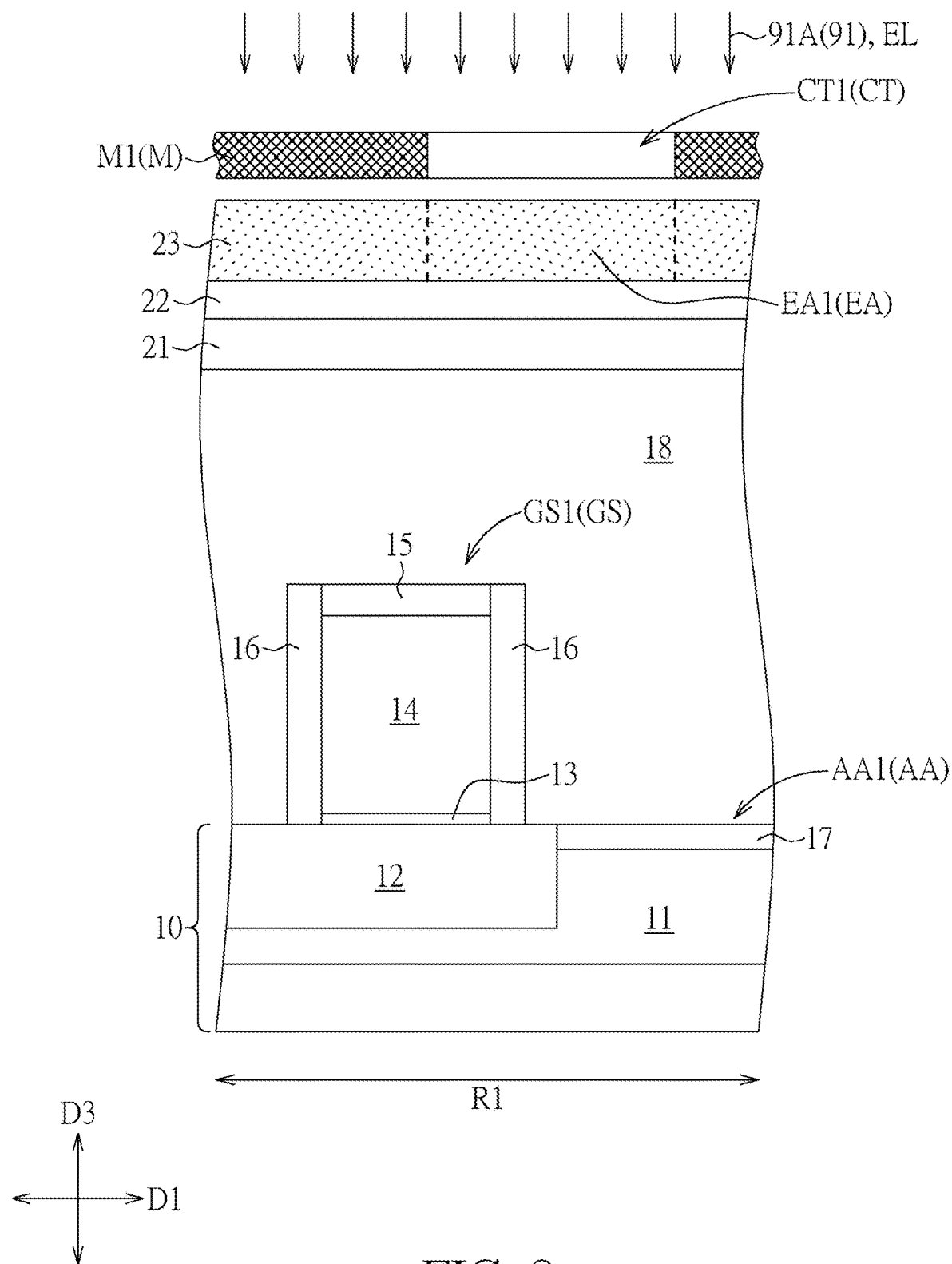
FIG. 8 is a cross-sectional schematic drawing partially illustrating a first exposure step according to an embodiment of the present invention.
Figure 9:
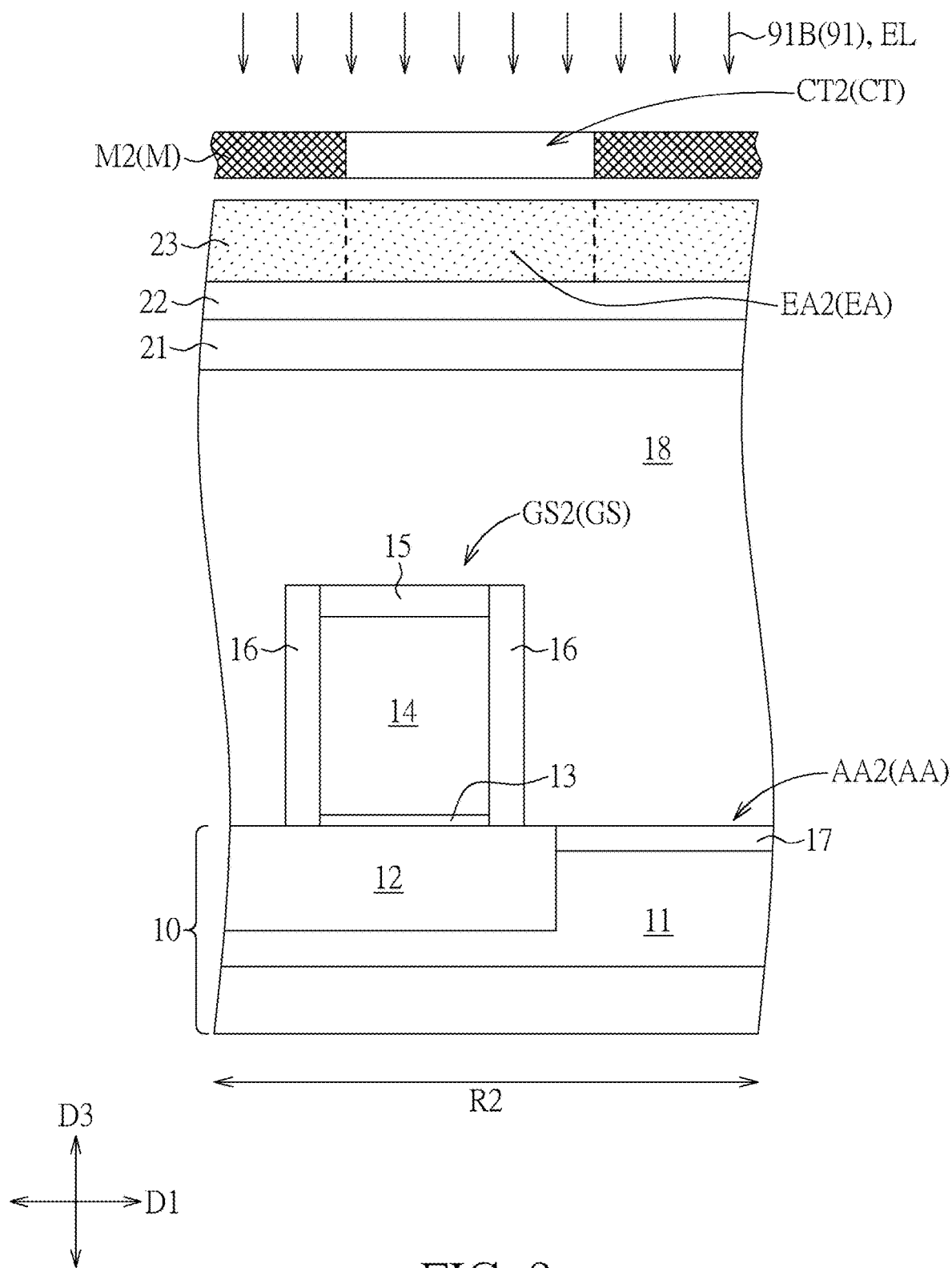
FIG. 9 is a cross-sectional schematic drawing partially illustrating a second exposure step according to an embodiment of the present invention.

Please refer to FIG. 8 and FIG. 9. FIG. 8 is a cross-sectional schematic drawing partially illustrating the first exposure step 91A according to an embodiment of the present invention, and FIG. 9 is a cross-sectional schematic drawing partially illustrating a second exposure step 91B according to an embodiment of the present invention. As shown in FIG. 8 and FIG. 9, before the exposure process, a dielectric layer 18 may be formed on the substrate 10 and cover the gate structures GS and the active regions AA, and a photoresist layer 23 may be formed on the dielectric layer 18. Additionally, in some embodiments, isolation structures 12, well regions 11, and doped regions 17 may be formed in the substrate 10, the isolation structures 12 may be used to define the active regions AA in the substrate 10, and the doped regions 17 may be located in the active regions AA and be regarded as source/drain doped regions, but not limited thereto. The isolation structure 12 may include a single layer or multiple layers of insulation materials, such as an oxide insulation material, an oxynitride insulation material, or other suitable insulation materials, and the doped regions 17 and the well regions 11 may be doped regions formed by implanting appropriate dopants into the substrate 10, respectively. Additionally, in some embodiments, each of the gate structures GS may include a gate dielectric layer 13, a gate electrode 14, a capping layer 15, and a spacer 16. The gate dielectric layer 13, the gate electrode 14, and the capping layer 15 may be disposed and stacked in the third direction D3, and the spacer 16 may be disposed on sidewalls of the gate dielectric layer 13, the gate electrode 14, and the capping layer 15, but not limited thereto. The gate dielectric layer 13 may include an oxide layer, such as a silicon oxide layer, or other suitable dielectric materials, such as high dielectric constant dielectric materials. The gate electrode 14 may include non-metallic gate, such as a polysilicon gate, or a non-metallic gate formed with other suitable conductive materials or a metal gate. The capping layer 15 may include silicon nitride, silicon carbonitride, or other suitable insulation materials. The spacer 16 may include a single layer or multiple layers of dielectric materials, such as oxide, nitride, oxynitride, or other suitable dielectric materials.

In some embodiments, before the step of forming the photoresist layer 23, a dielectric layer 21 and an anti-reflection layer 22 may be formed on the dielectric layer 18. The dielectric layer 21 may include an organic distribution layer (ODL) or other suitable organic or inorganic materials. The anti-reflection layer 22 may include a silicon-containing hard mask bottom anti-reflecting coating (SHB) layer or other suitable anti-reflection materials. The dielectric layer 18 may include a single layer or multiple layers of dielectric materials, such as silicon oxide, silicon nitride, silicon oxynitride, or other suitable dielectric materials. In each exposure step of the exposure process 91, the photoresist layer 23 on the substrate 10 may be illuminated by exposure light EL passing through a part of the photomask M. In some embodiments, the contact pattern CT in the photomask M may be a light transmission area, and the exposure light EL may pass through the contact pattern CT of the photomask M for illustrating the photoresist layer 23 on the substrate 10, in order to transfer the contact pattern CT to the photoresist layer 23 by a required proportion and form the exposed region EA in the photoresist layer 23, but not limited thereto. Therefore, in the deviated exposure step described above, the exposure light EL may pass through the photomask M for illustrating the photoresist layer 23 with the intentional overlay shift between the photomask M and the substrate 10, in order to change the location of the exposed region in the photoresist layer 23 and the located of the contact structure subsequently formed.

Figure 10:
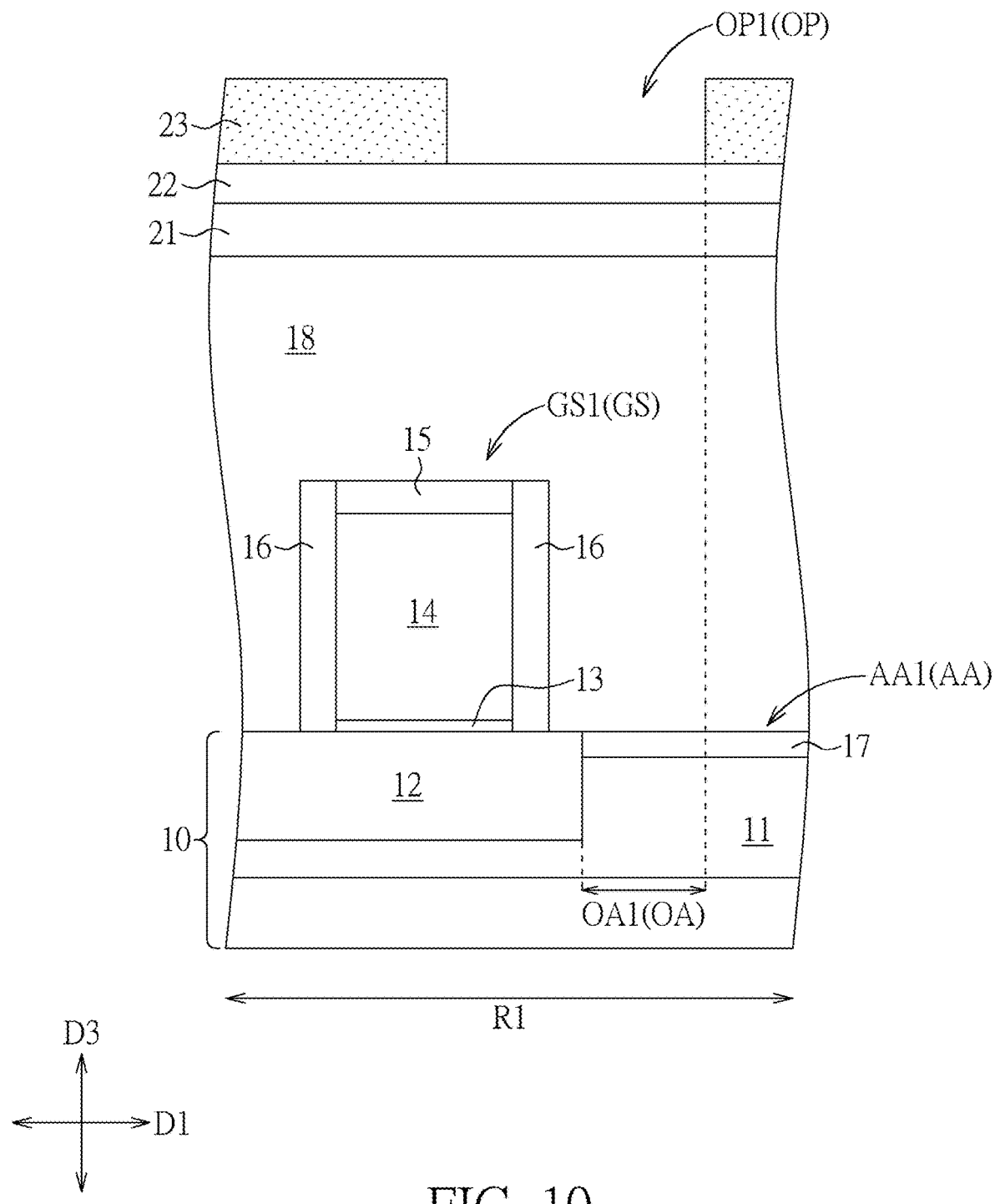
FIG. 10 is a cross-sectional schematic drawing partially illustrating a first region after a develop process according to an embodiment of the present invention.
Figure 11:
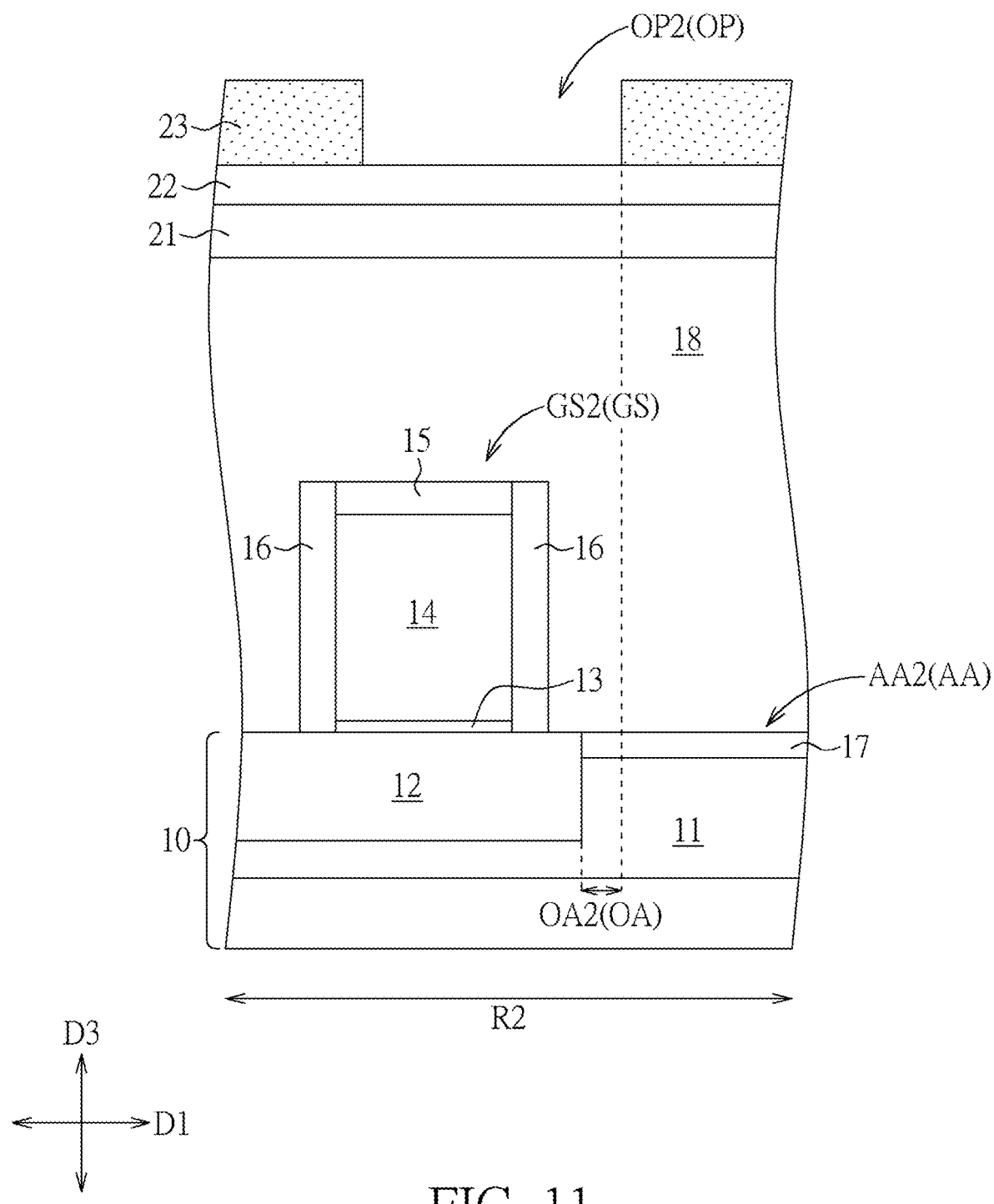
FIG. 11 is a cross-sectional schematic drawing partially illustrating a second region after a develop process according to an embodiment of the present invention.
Figure 12:
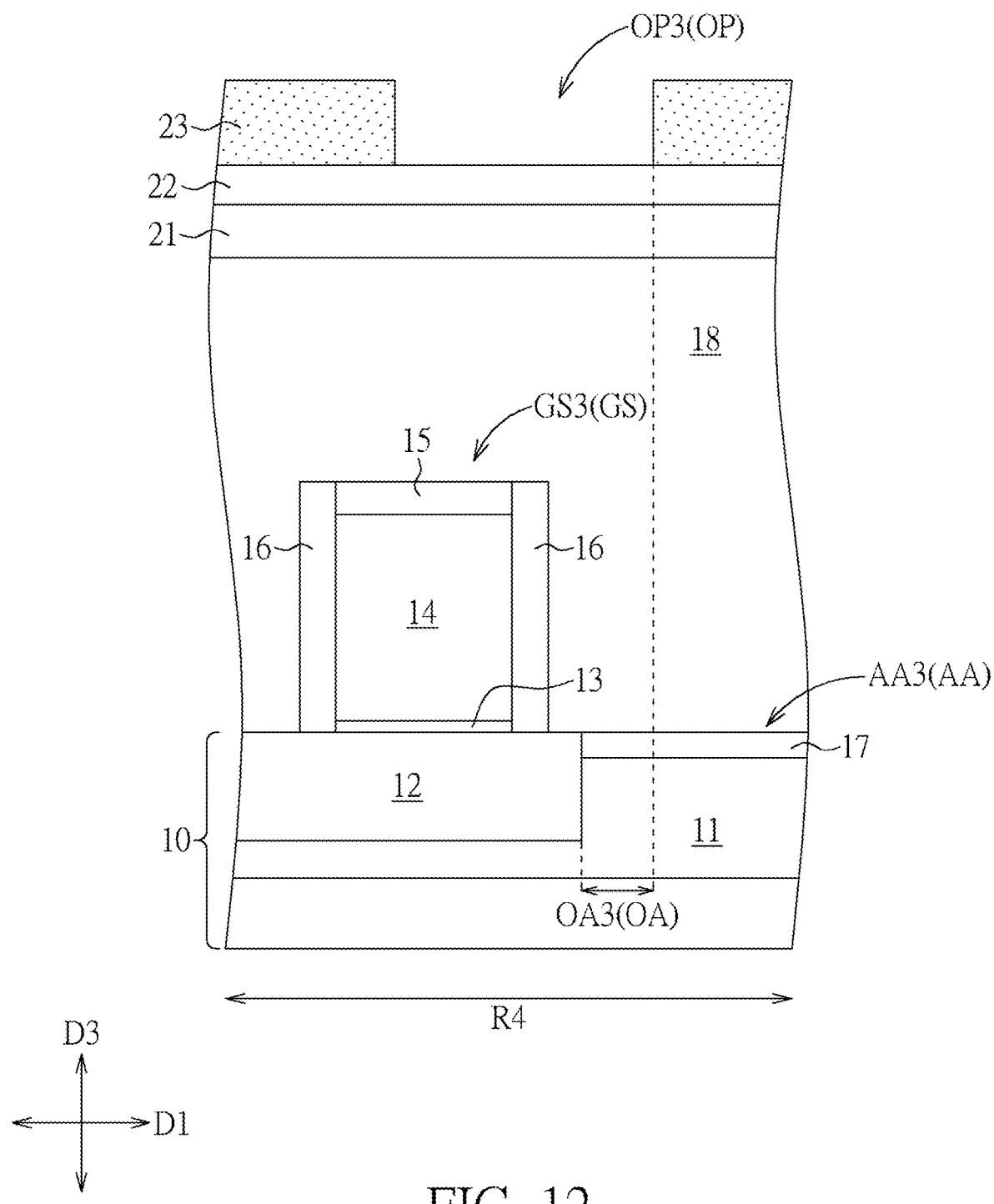
FIG. 12 is a cross-sectional schematic drawing partially illustrating a third region after a develop process according to an embodiment of the present invention.
Figure 13:
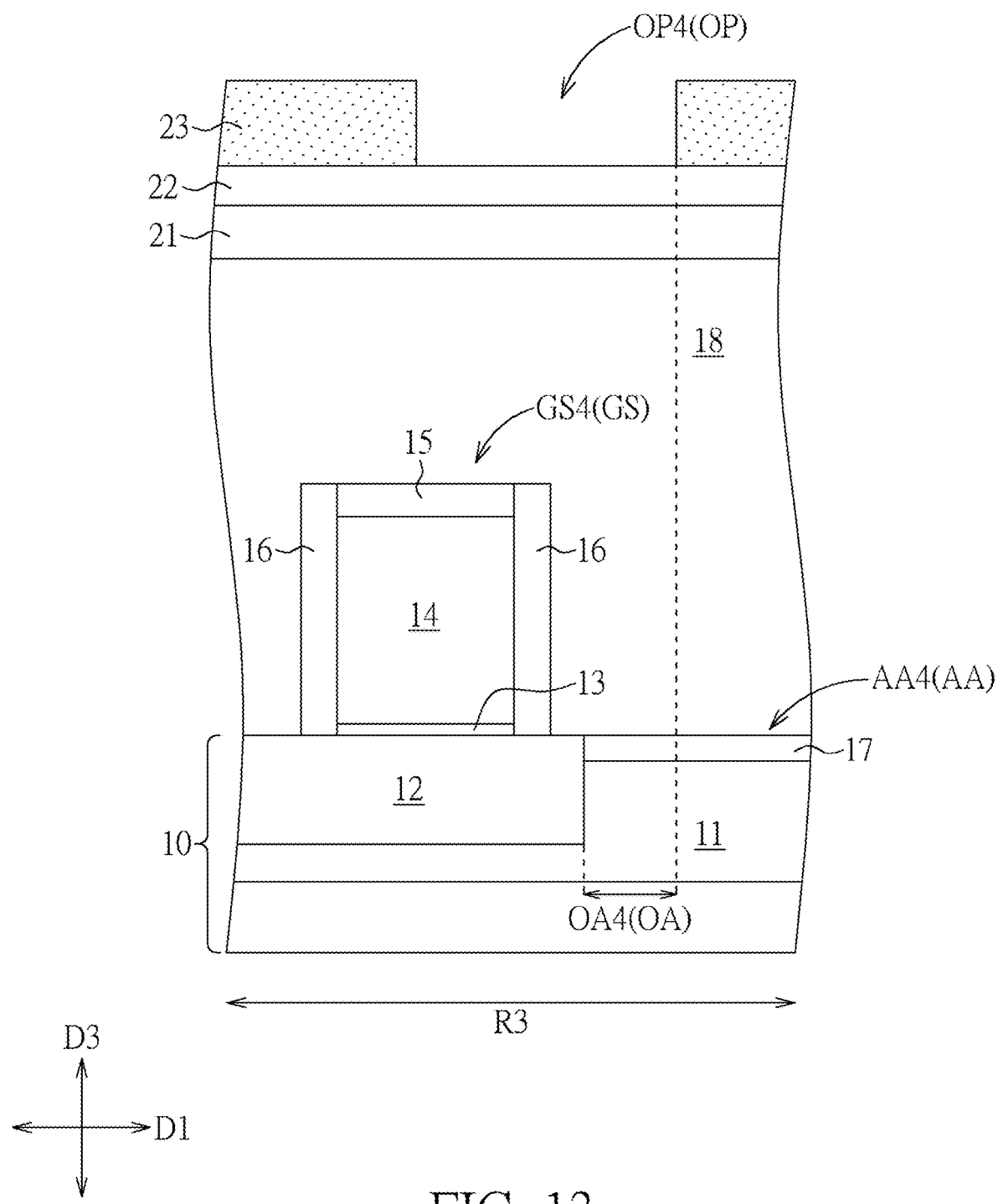
FIG. 13 is a cross-sectional schematic drawing partially illustrating a fourth region after a develop process according to an embodiment of the present invention.

Please refer to FIG. 1 and FIGS. 10-13. FIG. 10 is a cross-sectional schematic drawing partially illustrating the first region after the develop process according to an embodiment of the present invention, FIG. 11 is a cross-sectional schematic drawing partially illustrating the second region after the develop process in this embodiment, FIG. 12 is a cross-sectional schematic drawing partially illustrating the third region after the develop process in this embodiment, and FIG. 13 is a cross-sectional schematic drawing partially illustrating the fourth region after the develop process in this embodiment. As shown in FIG. 1 and FIGS. 10-13, the develop process is performed after the exposure process described above for forming a plurality of openings OP in the photoresist layer 23. For instance, a first opening OP1 formed in the photoresist layer 23 on the first region R1 may be located corresponding to the first contact pattern CT1 and/or the first exposed region EA1 in the first exposure step shown in FIG. 4 described above, a second opening OP2 formed in the photoresist layer 23 on the second region R2 may be located corresponding to the second contact pattern CT2 and/or the second exposed region EA2 in the second exposure step shown in FIG. 5 described above, a third opening OP3 formed in the photoresist layer 23 on the third region R3 may be located corresponding to the third contact pattern CT3 and/or the third exposed region EA3 in the third exposure step shown in FIG. 6 described above, and a fourth opening OP4 formed in the photoresist layer 23 on the fourth region R4 may be located corresponding to the fourth contact pattern CT4 and/or the fourth exposed region EA4 in the fourth exposure step shown in FIG. 7 described above.

In some embodiments, overlap areas OA where the openings OP overlap the active regions AA in the third direction D3 within different regions may be different from one another because the first exposure step may be the normal exposure step performed without an intentional overlay shift, and the second exposure step, the third exposure step, and the fourth exposure step may be deviated exposure steps with different overlay shifts respectively. For instance, a first overlap area OA1 where the first opening OP1 on the first region R1 and the first active region AA1 overlap each other in the third direction D3 may be relatively larger; a second overlap area OA2 where the second opening OP2 on the second region R2 and the second active region AA2 overlap each other in the third direction D3 may be smaller than the first overlap area OA1; a third overlap area OA3 where the third opening OP3 on the third region R3 and the third active region AA3 overlap each other in the third direction D3 may be smaller than the first overlap area OA1 and greater than the second overlap area OA2; and a fourth overlap area OA4 where the fourth opening OP4 on the fourth region R4 and the fourth active region AA4 overlap each other in the third direction D3 may be smaller than the first overlap area OA1 and greater than the third overlap area OA3, but not limited thereto.

Figure 14:
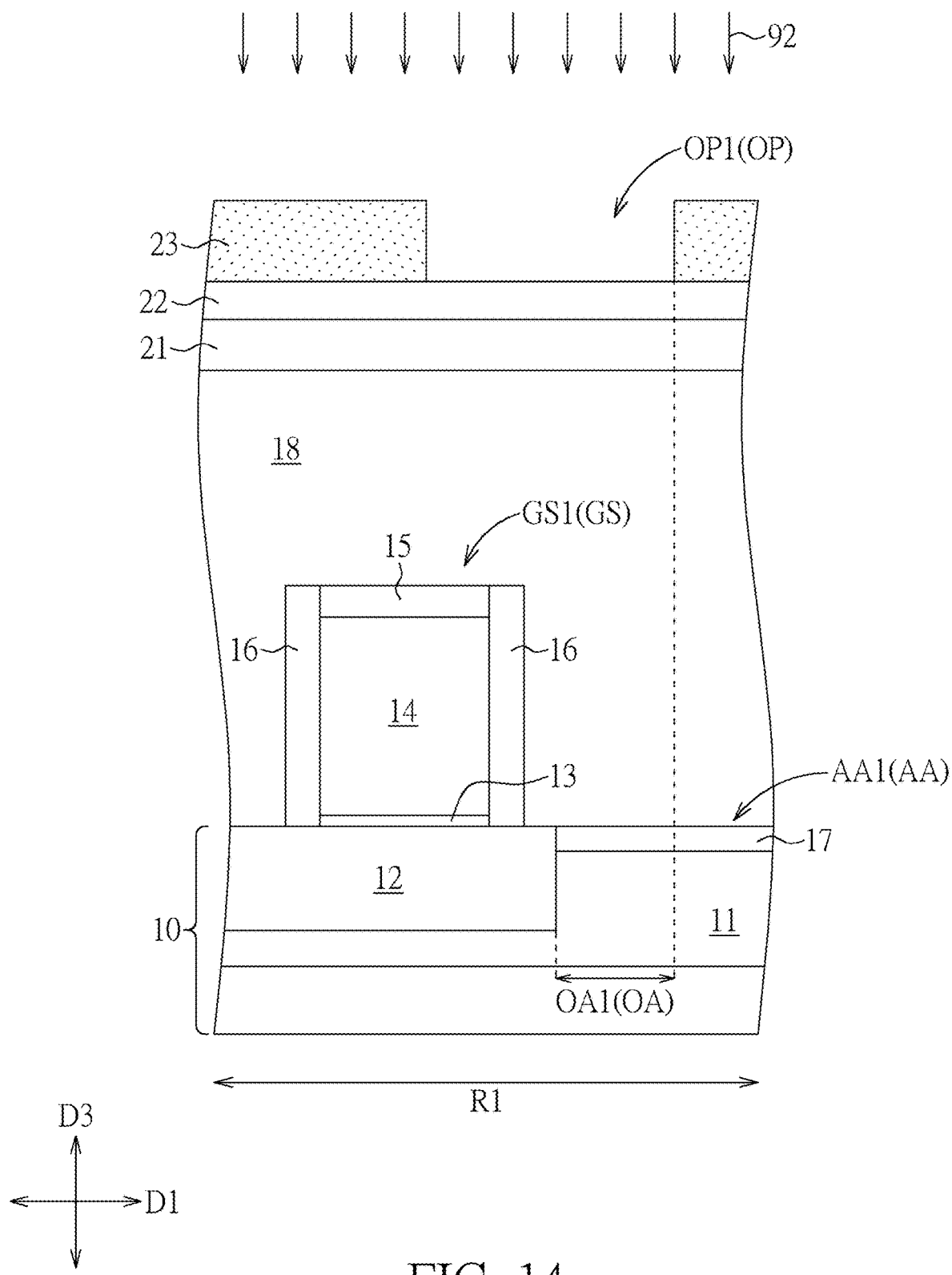
Figure 15:
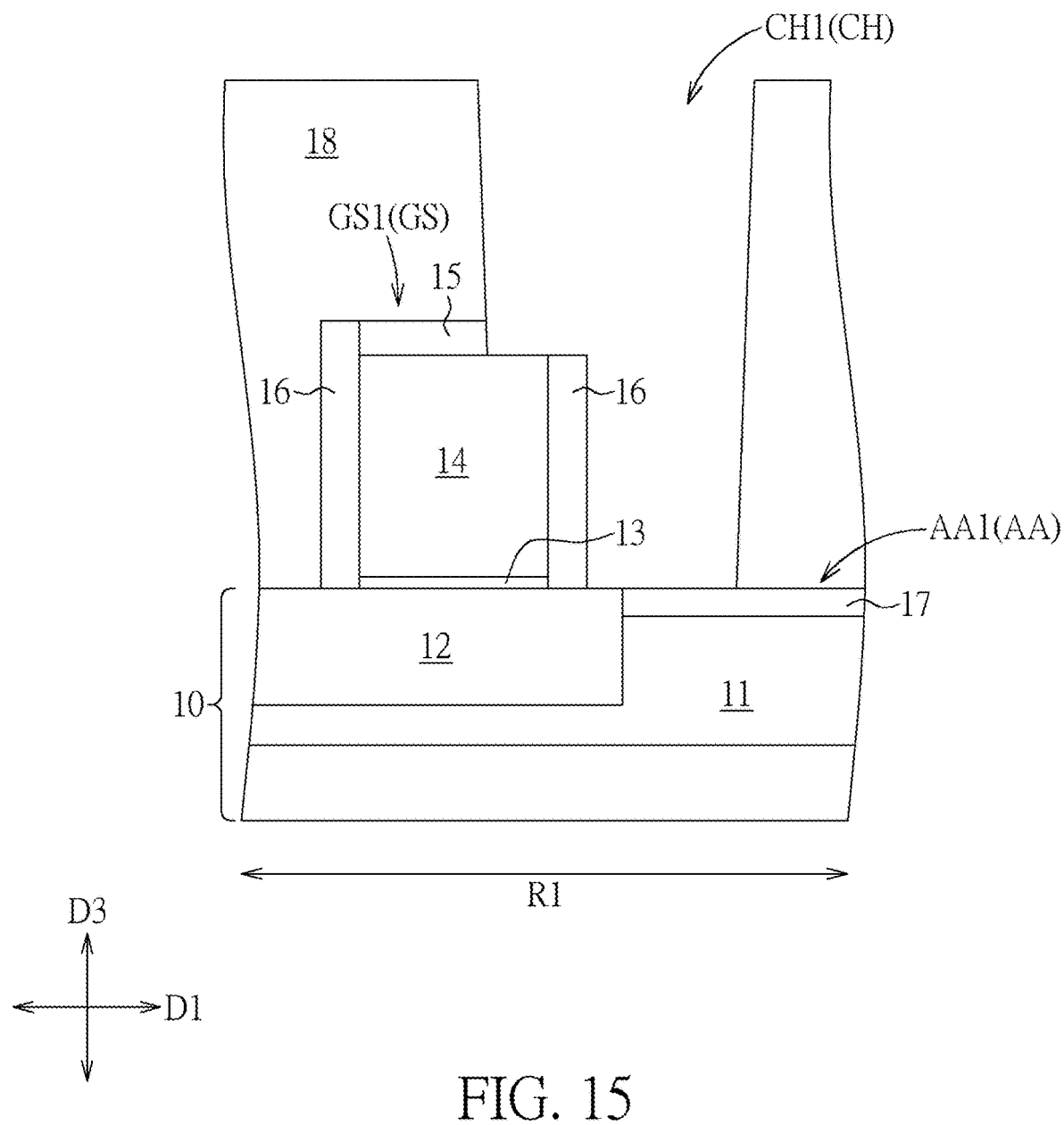
Figure 16:
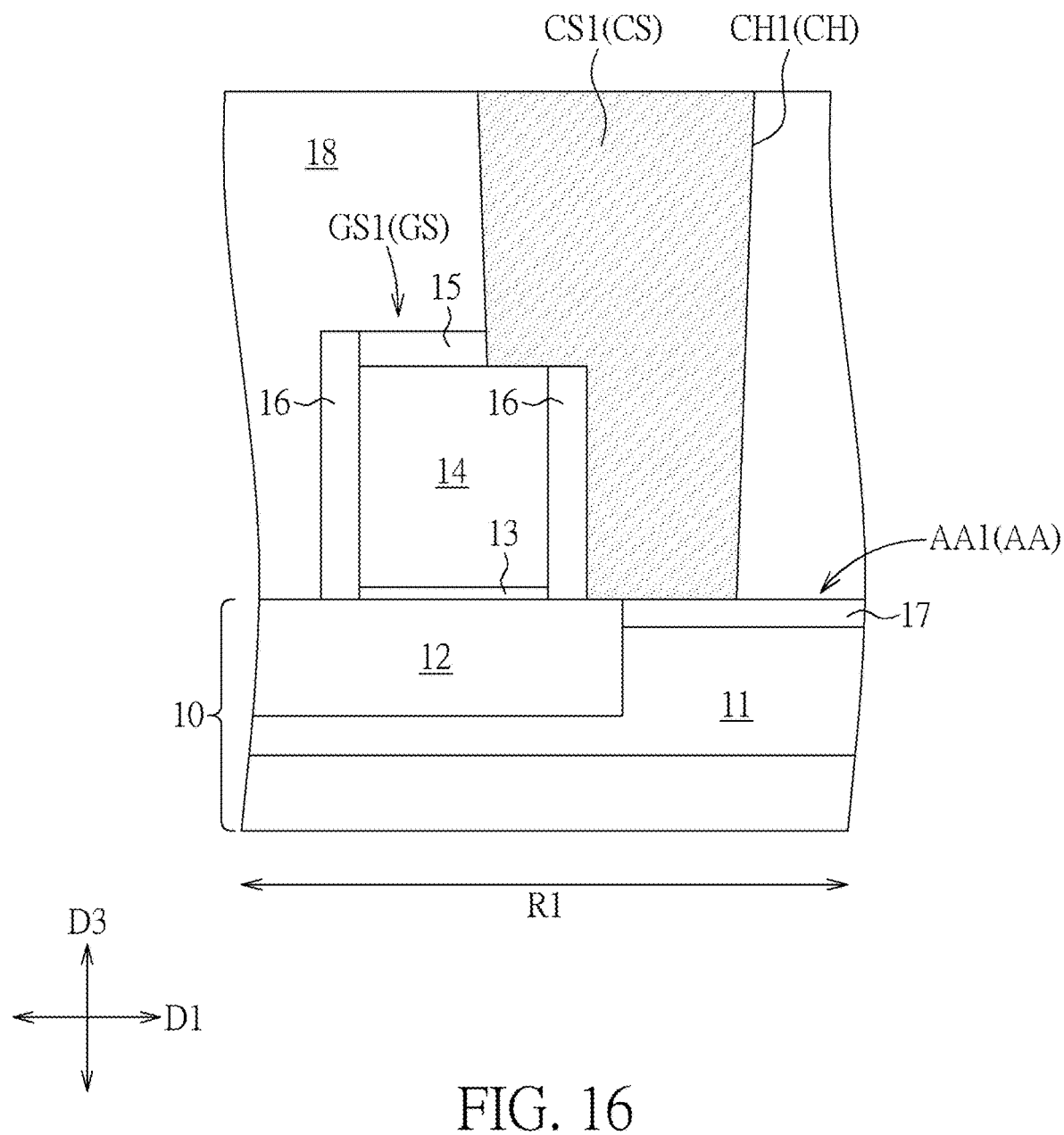
FIG. 16 is a cross-sectional schematic drawing partially illustrating a first region after forming a contact structure according to an embodiment of the present invention.
Figure 17:
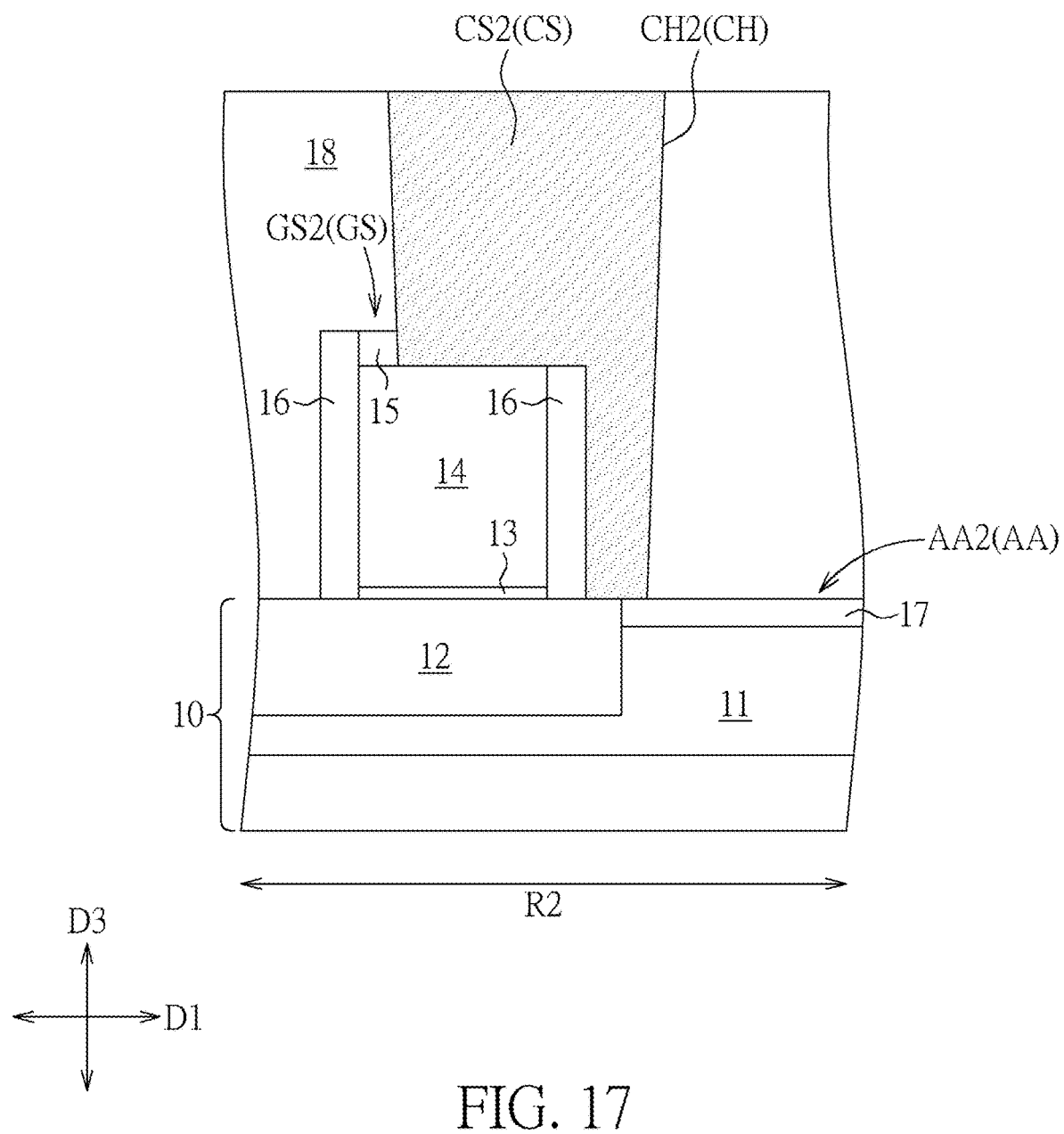
FIG. 17 is a cross-sectional schematic drawing partially illustrating a second region after forming a contact structure according to an embodiment of the present invention.

Please refer to FIG. 1 and FIGS. 14-17. FIG. 14 and FIG. 15 are schematic drawings illustrating an etching process in a manufacturing method of a contact structure according to an embodiment of the present invention, wherein FIG. 15 is a schematic drawing in a step subsequent to FIG. 14. FIG. 16 is a cross-sectional schematic drawing partially illustrating the first region after forming a contact structure according to an embodiment of the present invention, and FIG. 17 is a cross-sectional schematic drawing partially illustrating the second region after forming a contact structure according to an embodiment of the present invention. As shown in FIG. 1, FIG. 14, and FIG. 15, after the develop process described above, step S16 may be carried out for performing an etching process 92 to the dielectric layer 18 with the photoresist layer 23 as a mask for forming a plurality of contact holes CH in the dielectric layer 18. Each of the contact holes CH may be formed corresponding to one of the openings OP in the photoresist layer 23 in the third direction D3. In other words, the etching process 92 may be used to transfer the pattern of the openings OP to the dielectric layer 18 for forming the contact holes CH. In addition, the photoresist layer 23, the anti-reflection layer 22, and the dielectric layer 21 may be removed after the step of forming the contact holes CH and/or during the etching process 92. In some embodiments, a first contact hole CH1 located above the first region R1 may penetrate through the dielectric layer 18 in the third direction D3 for exposing a part of the first active region AA1, and the first contact hole CH1 may penetrate through the dielectric layer 18 on the first gate structure GS1 and the capping layer 15 in the third direction D3 for exposing a part of the gate electrode 14. Subsequently, step S17 may be carried out for forming a plurality of contact structures CS in the dielectric layer 18, and each of the contact structures CS may be formed in one of the contact holes CH. As shown in FIG. 15 and FIG. 16, a first contact structure CS1 may be formed in the first contact hole CH1, and a second contact structure CS2 may be formed in the second contact hole CH2. In some embodiments, each of the contact structures CS may include a barrier layer and a low resistivity material disposed on the barrier layer, but not limited thereto. The barrier layer described above may include titanium nitride, tantalum nitride, or other suitable barrier materials, and the low resistivity material described above may include a material having relatively lower resistivity, such as copper, aluminum, tungsten, and so forth, but not limited thereto. An area where the second contact structure CS2 is connected with the second active region AA2 may be smaller than an area where the first contact structure CS1 is connected with the first active region AA1 because the second contact hole CH2 corresponding to the second contact structure CS2 is formed by the above-mentioned deviated exposure step performed with the overlay shift and the first contact hole CH1 corresponding to the first contact structure CS1 is formed by the above-mentioned normal exposure step performed without an intentional overlay shift. In other words, the process window of the contact structure CS formed by the deviated exposure step may become relatively smaller and that can be used to evaluate and/or modify process conditions of the etching process described above.

Figure 18:
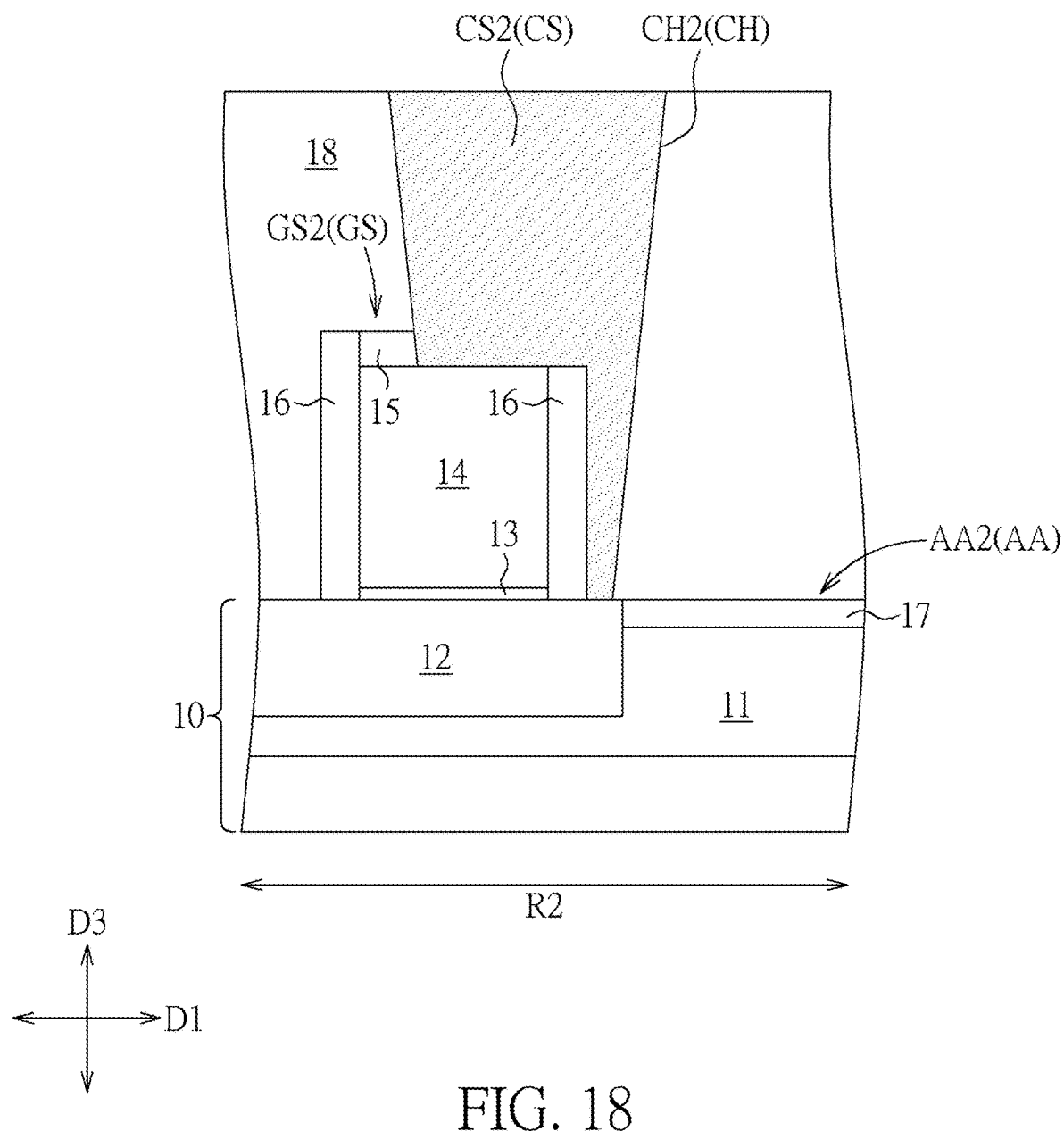
FIG. 18 is a cross-sectional schematic drawing partially illustrating a second region after forming a contact structure according to another embodiment of the present invention.

Please refer to FIG. 17 and FIG. 18. FIG. 18 is a cross-sectional schematic drawing partially illustrating the second region after forming the contact structure according to another embodiment of the present invention. In some embodiments, the process condition of the etching process for forming the contact hole CH in FIG. 18 may be different from the process condition of the etching process for forming the contact hole CH in FIG. 17, or FIG. 18 may be regarded a drawing illustrating the condition of the contact structure CS when problems (such as worse etching uniformity and/or insufficient etching at some areas) occur because the process window of the etching process is not sufficient. As shown in FIG. 17, when the process window of the etching process for forming the contact hole CH is sufficient and/or there is not any issue in the etching process, the second contact structure CS2 may still be electrically connected with the active region AA and/or the dope region 17 effectively even though the second contact structure CS2 above the second region R2 is formed by the deviated exposure step with relatively smaller process margin. However, as shown in FIG. 18, when the process window of the etching process for forming the contact hole CH is not sufficient, some of the contact holes CH may be different from the ideal condition. For instance, the critical dimension (CD) of the contact hole CH may be too small, and the defect may be generated because the contact structure CS cannot be electrically connected with the active region AA and/or the dope region 17 effectively especially when the bottom CD of the contact hole CH is too small. Therefore, in the manufacturing method of the present invention, the process margin of the contact structures on some regions may become smaller by the deviated exposure steps, and the process conditions of the etching process described above may be evaluated and/or modified accordingly for obtaining an etching process with improved process window.

Figure 19:
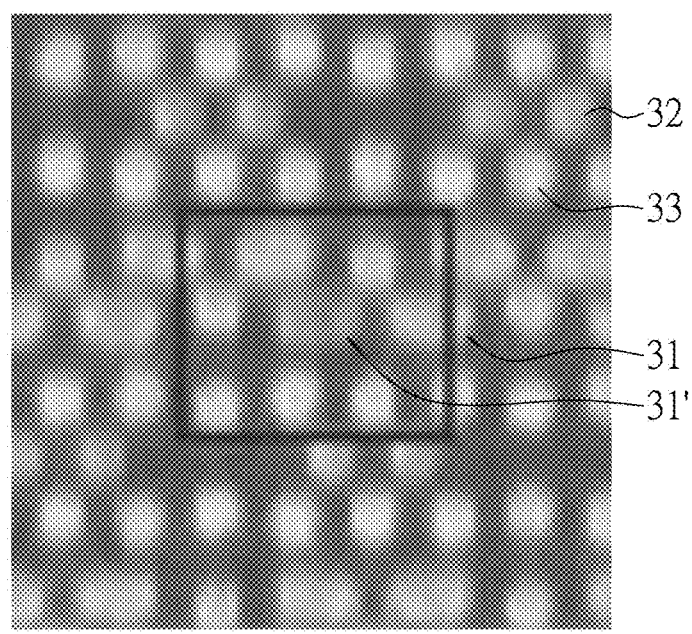
FIG. 19 is a schematic drawing of image analysis of an electron beam inspection according to an embodiment of the present invention.

Please refer to FIG. 1 and FIGS. 16-19. FIG. 19 is a schematic drawing of image analysis of an electron beam inspection according to an embodiment of the present invention. As shown in FIG. 1 and FIGS. 16-18, after the step of forming the contact structures CS, step S18 may be carried out for performing a defect inspection to the contact structures CS so as to detect whether there are defects in each contact structure CS as shown in FIG. 18. Subsequently, step S19 may be carried out for modifying the process condition of the above-mentioned etching process configured to form the contact holes CH according to a result of the defect inspection, the process window of the etching process may be improved, and the manufacturing yield of the contact structures CS may be enhanced accordingly. In some embodiments, the defect inspection described above may include an electron beam (E-beam) inspection or other suitable defect inspection approaches. For example, as shown in FIGS. 17-19, in the image analysis of the electron beam inspection where a voltage contrast (VC) mode is applied, the image corresponding to the contact structure CS electrically connected with the active region AA effectively is bright (such as a region 31), and the image corresponding to the contact structure CS failing in being electrically connected with the active region AA effectively is relatively darker (such as a region 31'). Therefore, the region 31 may correspond to the normal contact structure CS (such as the second contact structure CS2 shown in FIG. 17), and the region 31' may corresponding to the contact structure CS with the defect (such as the second contact structure CS2 shown in FIG. 18). Additionally, in some embodiments, the contact structure CS may be a contact structure (such as slot contacts) configured to electrically connect a specific gate electrode and a specific drain electrode respectively in a static random access memory (SRAM) structure, and a region 32 and a region 33 shown in FIG. 19 may be an image of a contact structure corresponding to a specific gate electrode and an image of a contact structure corresponding to a specific source electrode in this SRAM structure, respectively, but not limited thereto.

Therefore, the condition of each contact structure CS on the substrate 10 may be scanned by the electron beam inspection for calculating the proportion of contact structure defects occurring in the regions corresponding to the normal exposure steps and the deviated exposure steps on the substrate 10, and that may be used as a reference and/or basis for adjusting the etching process described above. For example, when the number of contact structure defects is obviously positively correlated with the overlay shift amount of the deviated exposure step, if the number of contact structure defects is reduced effectively by modifying the process conditions of the etching process for forming the contact hole CH, the modified etching process may have an improved process window. Therefore, the manufacturing method of the contact structure in the present invention may be used to improve the process window of the contact structure and enhance the manufacturing yield of the related products.

To summarize the above descriptions, in the manufacturing method of the contact structure according to the present invention, different exposure steps may be performed to different regions of the substrate, respectively, and some of the exposure steps are performed with overlay shifts. The process margin in some regions may become smaller accordingly, and the defects generated in subsequent processes may be detected more easily. Therefore, the manufacturing method may be used to modify related process conditions for improving the manufacturing yield of the contact structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a contact structure, comprising:

providing a substrate, wherein the substrate comprises a first region and a second region;

forming a dielectric layer on the substrate;
forming a photoresist layer on the dielectric layer;
performing an exposure process, wherein the exposure process comprises:
first exposure steps, wherein each of the first exposure steps is performed to a part of the first region of the substrate; and
second exposure steps, wherein each of the second exposure steps is performed to a part of the second region of the substrate, and each of the second exposure steps is performed with a first overlay shift by a first predetermined distance; and
performing a develop process for forming openings in the photoresist layer.

2. The manufacturing method of the contact structure according to claim 1, wherein the exposure process further comprises deviated exposure steps with overlay shifts, the overlay shift of each of the deviated exposure steps is different from the first overlay shift, and the overlay shifts of at least two of the deviated exposure steps are different from each other.

3. The manufacturing method of the contact structure according to claim 1, wherein each of the first exposure steps is performed with a photomask, and each of the second exposure steps is performed with the photomask.

4. The manufacturing method of the contact structure according to claim 3, wherein each of the second exposure steps comprises:
performing an alignment step for aligning the substrate and the photomask;
adjusting a position of the photomask or a position of the substrate for generating the first overlay shift; and
illuminating the substrate by exposure light passing through a part of the photomask with the first overlay shift.

5. The manufacturing method of the contact structure according to claim 3, wherein each of the first exposure steps comprises:
performing an alignment step for aligning the substrate and the photomask; and
illuminating a part of the substrate by exposure light passing through the photomask without an intentional overlay shift between the substrate and the photomask.

6. The manufacturing method of the contact structure according to claim 3, further comprising:
forming a first active region in the first region of the substrate before the step of forming the dielectric layer; and
forming a second active region in the second region of the substrate before the step of forming the dielectric layer, wherein the dielectric layer covers the first active region and the second active region.

7. The manufacturing method of the contact structure according to claim 6, wherein the photomask comprises a contact pattern, a first exposed region is formed in the photoresist layer and formed by at least one of the first exposure steps via the contact pattern, and a second exposed region is formed in the photoresist layer and formed by at least one of the second exposure steps via the contact pattern, wherein the first exposed region overlaps a part the first active region, and the second exposed region overlaps a part of the second active region.

8. The manufacturing method of the contact structure according to claim 7, wherein an area of the part of the second active region overlapped by the second exposed region is smaller than an area of the part of the first active region overlapped by the first exposed region.

9. The manufacturing method of the contact structure according to claim 7, further comprising:
forming a first gate structure on the first region of the substrate before the step of forming the dielectric layer; and
forming a second gate structure on the second region of the substrate before the step of forming the dielectric layer, wherein the dielectric layer covers the first gate structure and the second gate structure.

10. The manufacturing method of the contact structure according to claim 9, wherein the first exposed region further overlaps a part of the first gate structure, and the second exposed region further overlaps a part of the second gate structure.

11. The manufacturing method of the contact structure according to claim 10, wherein an area of the part of the second gate structure overlapped by the second exposed region is greater than an area of the part of the first gate structure overlapped by the first exposed region.

12. The manufacturing method of the contact structure according to claim 9, wherein the second gate structure is disposed adjacent to the second active region in a horizontal direction, and the first overlay shift is generated in the horizontal direction.

13. The manufacturing method of the contact structure according to claim 1, wherein the substrate further comprises a third region, the exposure process further comprises third exposure steps, and each of the third exposure steps is performed to a part of the third region of the substrate.

14. The manufacturing method of the contact structure according to claim 13, wherein each of the third exposure steps is performed with a second overlay shift by a second predetermined distance.

15. The manufacturing method of the contact structure according to claim 14, wherein the second predetermined distance is different from the first predetermined distance.

16. The manufacturing method of the contact structure according to claim 14, wherein the first overlay shift and the second overlay shift are generated in the same direction.

17. The manufacturing method of the contact structure according to claim 14, wherein each of the first exposure steps, each of the second exposure steps, and each of the third exposure steps are performed with the same photomask.

18. The manufacturing method of the contact structure according to claim 1, further comprising:
performing an etching process to the dielectric layer with the photoresist layer as a mask after the develop process for forming contact holes in the dielectric layer, wherein each of the contact holes is formed corresponding to one of the openings in the photoresist layer in a vertical direction; and
forming contact structures in the dielectric layer, wherein each of the contact structures is formed in one of the contact holes.

19. The manufacturing method of the contact structure according to claim 18, further comprising:
performing a defect inspection to the contact structures; and
modifying the etching process according to a result of the defect inspection.

20. The manufacturing method of the contact structure according to claim 19, wherein the defect inspection comprises an electron beam (E-beam) inspection.

* * * * *